US009799669B2

(12) United States Patent
Rabkin et al.

(10) Patent No.: US 9,799,669 B2
(45) Date of Patent: Oct. 24, 2017

(54) SINGLE-SEMICONDUCTOR-LAYER CHANNEL IN A MEMORY OPENING FOR A THREE-DIMENSIONAL NON-VOLATILE MEMORY DEVICE

(71) Applicant: SANDISK TECHNOLOGIES INC., Plano, TX (US)

(72) Inventors: Peter Rabkin, Cupertino, CA (US); Jayavel Pachamuthu, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/972,618

(22) Filed: Dec. 17, 2015

(65) Prior Publication Data
US 2016/0111432 A1 Apr. 21, 2016

Related U.S. Application Data

(62) Division of application No. 14/462,156, filed on Aug. 18, 2014, now Pat. No. 9,230,980.
(Continued)

(51) Int. Cl.
*H01L 27/115* (2017.01)
*H01L 27/1157* (2017.01)
(Continued)

(52) U.S. Cl.
CPC ...... *H01L 27/1157* (2013.01); *G11C 16/0483* (2013.01); *H01L 27/11524* (2013.01);
(Continued)

(58) Field of Classification Search
CPC .................................................. H01L 27/115
(Continued)

(56) References Cited

U.S. PATENT DOCUMENTS

| 5,915,167 A | 6/1999 | Leedy |
| 6,998,305 B2 | 2/2006 | Arena et al. |

(Continued)

FOREIGN PATENT DOCUMENTS

WO  WO02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Sheng Zhu
(74) *Attorney, Agent, or Firm* — The Marbury Law Group PLLC

(57) ABSTRACT

A memory film layer is formed in a memory opening through an alternating stack of first material layers and second material layers. A sacrificial material layer is deposited on the memory film layer. Horizontal portions of the sacrificial material layer and the memory film layer at the bottom of the memory opening is removed by an anisotropic etch to expose a substrate underlying the memory opening, while vertical portions of the sacrificial material layer protect vertical portions of the memory film layer. After removal of the sacrificial material layer selective to the memory film, a doped semiconductor material layer can be formed directly on the exposed material in the memory opening and on the memory film as a single material layer to form a semiconductor channel of a memory device.

16 Claims, 15 Drawing Sheets

Related U.S. Application Data

(60) Provisional application No. 61/878,023, filed on Sep. 15, 2013, provisional application No. 61/879,071, filed on Sep. 17, 2013, provisional application No. 61/977,193, filed on Apr. 9, 2014.

(51) Int. Cl.
  *G11C 16/04* (2006.01)
  *H01L 27/11578* (2017.01)
  *H01L 27/11524* (2017.01)
  *H01L 27/11556* (2017.01)
  *H01L 27/11582* (2017.01)

(52) U.S. Cl.
  CPC .. *H01L 27/11556* (2013.01); *H01L 27/11578* (2013.01); *H01L 27/11582* (2013.01)

(58) Field of Classification Search
  USPC ............... 257/324, 347, 316, 314; 438/268
  See application file for complete search history.

(56) References Cited

U.S. PATENT DOCUMENTS

| | | | |
|---|---|---|---|
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,394,716 | B2 | 3/2013 | Hwang et al. |
| 8,614,126 | B1 | 12/2013 | Lee et al. |
| 8,658,499 | B2 | 2/2014 | Makala et al. |
| 8,946,023 | B2 | 2/2015 | Makala et al. |
| 8,987,089 | B1 | 3/2015 | Pachamuthu et al. |
| 2007/0210338 | A1 | 9/2007 | Orlowski |
| 2007/0252201 | A1 | 11/2007 | Kito et al. |
| 2009/0101969 | A1 | 4/2009 | Katsumata et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0163968 | A1* | 7/2010 | Kim ................... H01L 27/11582 257/324 |
| 2010/0181610 | A1 | 7/2010 | Kim et al. |
| 2010/0207195 | A1 | 8/2010 | Fukuzumi et al. |
| 2010/0258852 | A1 | 10/2010 | Lim et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0294290 | A1* | 12/2011 | Nakanishi et al. ........... 438/666 |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0068255 | A1* | 3/2012 | Lee ................... H01L 27/11582 257/324 |
| 2012/0256247 | A1 | 10/2012 | Alsmeier |
| 2013/0153983 | A1* | 6/2013 | Jeon .............................. 257/324 |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0035026 | A1* | 2/2014 | Jang et al. .................... 257/324 |
| 2014/0225181 | A1 | 8/2014 | Makala et al. |
| 2015/0076580 | A1 | 3/2015 | Pachamuthu et al. |
| 2015/0076584 | A1 | 3/2015 | Pachamuthu et al. |
| 2015/0179660 | A1 | 6/2015 | Yada et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

International Application No. PCT/US2014/054246, Invitation to Pay Additional Fees and Partial International Search Report, issued Dec. 3, 2014.

Notification Concerning Transmittal of International Preliminary Report on Patentability from the International Bureau for International Patent Application No. PCT/US2014/054246, mailed Mar. 24, 2016, 12 pages.

* cited by examiner

SINGLE-SEMICONDUCTOR-LAYER CHANNEL IN A MEMORY OPENING FOR A THREE-DIMENSIONAL NON-VOLATILE MEMORY DEVICE

RELATED APPLICATION

This application is a divisional of U.S. application Ser. No. 14/462,156, filed Aug. 18, 2014, which claims the benefit of priority from U.S. Provisional Application No. 61/878,023, filed Sep. 15, 2013, U.S. Provisional Application No. 61/879,071, filed Sep. 17, 2013, and U.S. Provisional Application No. 61/977,193, filed Apr. 9, 2014, the entire contents of which are incorporated by reference herein.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory structure sometimes referred to as Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

During formation of memory cells for the BiCS architecture, a memory film layer is deposited in each memory opening through an alternating stack of first material layers and second material layers. In order to protect vertical portions of the memory film layer during a subsequent anisotropic etch, a first semiconductor material layer may be conformally deposited on the contiguous memory film layer. The horizontal bottom portion of the memory film layer can be removed from each memory opening by an anisotropic etch to physically expose a first electrode or the substrate underlying the memory opening. A second semiconductor material layer is subsequently deposited directly on the first electrode or the substrate exposed in the memory opening and on the first semiconductor material layer. The first and second semiconductor material layers collectively function as a semiconductor channel of each memory cell in the NAND string.

SUMMARY

According to an aspect of the present disclosure, a method of fabricating a memory device is provided. A stack of alternating layers of a first material and a second material different from the first material is formed over a substrate including a semiconductor material. A portion of the stack is etched to form a memory opening extending from a top surface of the stack to a top surface of the substrate. A memory film layer is formed within the memory opening, and a sacrificial material layer is formed on the memory film layer. Horizontal portions of the sacrificial material layer and the memory film layer are etched to physically expose a portion of the top surface of the substrate underneath the memory opening, while leaving a vertical portion of the sacrificial material layer remaining on a vertical portion of the memory film layer. The sacrificial material layer is removed selective to a remaining portion of the memory film layer.

According to an aspect of the present disclosure, a three-dimensional memory device is provided, which includes a substrate having a major surface, and an alternating stack of insulating material layers and control gate electrodes located over the substrate. The alternating stack has a memory opening extending through the alternating stack in a direction substantially perpendicular to the major surface. The three-dimensional memory device further includes a memory film located at a peripheral region of the memory opening, a semiconductor channel including a vertical portion extending substantially perpendicular to the major surface and contacting an inner sidewall of the memory film, and a single crystalline doped semiconductor material portion located within, or on, the substrate. A sidewall of the upper portion of the semiconductor channel in contact with the memory film is laterally offset with respect to a sidewall of the lower portion of the semiconductor channel in contact with the memory film. The semiconductor channel does not include a substantially contiguous interface composed of grain boundaries, not contacting the memory film, and vertically extending through the semiconductor channel between a plurality of the control gate electrodes.

DETAILED DESCRIPTION

Figure 1A:
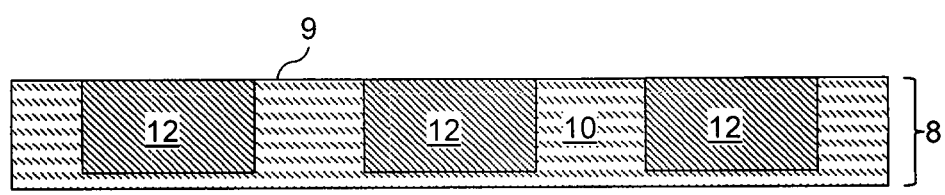
FIGS. 1A-1K are sequential vertical cross-sectional views of steps in a method of making a first exemplary device structure containing a NAND string according to a first embodiment of the present disclosure.

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

The two step semiconductor material deposition process in the prior art creates a substantially contiguous interface between the semiconductor layers. The substantially contiguous interface extends substantially throughout the entire extent of the first and second semiconductor material layers. A substantially contiguous set of grain boundaries typically run along the interface. The present inventors realized that the presence of the substantially contiguous set of grain boundaries between the first and second semiconductor material layers in prior art semiconductor channels is a significant source of defects in the semiconductor channel, increases the overall grain boundary area (i.e., the grain interface area), and often has the effect of reducing the average grain size in the semiconductor channel. Electrical characteristics of the memory cells can deteriorate due the large number of lattice defects that are concentrated at the grain boundary interfaces. The smaller the grain size, and the larger the interface area between grain boundaries, the larger the number of defects in semiconductor channel. Further, in order to form a contiguous film having a uniform thickness, each of the first and second semiconductor material layers needs to have a thickness greater than a minimum thickness required for uniform thickness. Due to such constraints, the two step doped semiconductor material deposition process as known in the art may lead to deterioration of boosting potential and program disturb, deterioration of the cell current, an increase in the variability of the memory cells, and/or an increase in the program noise.

A memory film layer is formed in a memory opening through an alternating stack of first material layers and second material layers for a three dimensional, vertical NAND string. A sacrificial material layer is deposited on the memory film layer. Horizontal portions of the sacrificial material layer and the memory film layer at the bottom of the memory opening are removed by an anisotropic etch to expose a first electrode or the substrate underlying the memory opening, while vertical portions of the sacrificial material layer protect vertical portions of the memory film layer. After selective removal of the sacrificial material without removing the memory film, a single semiconductor material layer can be formed on the first electrode or the substrate, and directly on the memory film as a single "uninterrupted" material layer, i.e., a material layer that does not include any interfacial layer therein as a consequence of being deposited in a single deposition step.

In one embodiment, the single semiconductor material layer can be a doped semiconductor material layer. In another embodiment, the single semiconductor material layer may not be an intentionally doped semiconductor material. If not intentionally doped, the single semiconductor material layer still may have a certain level of doping by p-type dopants or n-type dopants. In the case the single semiconductor material layer is a polysilicon layer, the type of doping may be p-type in one example, and the atomic concentration of the p-type dopants may be in a range from $5.0 \times 10^{16}/cm^3$ to $5.0 \times 10^{17}$ $cm^{/3}$, although higher or lower atomic concentrations can also occur depending on the process employed. The semiconductor material layer, whether doped intentionally or unintentionally, does not include any contiguous set of grain boundaries that runs parallel to the interface between the semiconductor material layer and the memory film. Dopant implantation and/or surface treatment of the first electrode or the substrate; vertical recessing of first electrode or the substrate; lateral recessing of the memory film selective to the sacrificial material layer; and/or formation of an epitaxial semiconductor material portion of the channel may be optionally performed prior to formation of the semiconductor material layer. Surface treatment of the semiconductor material layer may also be performed.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1A, a first exemplary device structure according to a first embodiment of the present disclosure includes a substrate 8, which can be a semiconductor substrate. The substrate 8 can include a substrate semiconductor layer 10 and optional first electrodes 12 (which can alternatively function as source or drain regions) embedded within the substrate semiconductor layer 10. Alternatively, the first electrodes may be omitted.

Optionally, additional material layers (not shown) may be present underneath the substrate 8. The substrate 8 can be a bulk semiconductor substrate, in which case the entirety of the substrate 8 is a semiconductor substrate. Alternatively, the substrate 8 can be a top semiconductor layer of a semiconductor-on-insulator (SOI) substrate or a top semiconductor material portion a hybrid substrate including at least one bulk semiconductor region and at least one SOI region. In this case, the substrate semiconductor layer 10 can be the top semiconductor layer of an SOI substrate, a semiconductor material layer in a bulk portion, or a top semiconductor portion of in an SOI region of a hybrid substrate.

The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having a resistivity in the range from $1.0 \times 10^{-5}$ Ohm-cm to $1.0 \times 10^5$ Ohm-cm, and is capable of producing a doped material having a resistivity in a range from $1.0 \times 10^{-5}$ Ohm-cm to 1.0 Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "major surface" refers to a planar surface having a greater area than at least another surface that may be another planar surface or a curved surface. As used herein, a planar surface is a surface that is contained within a Euclidean two-dimensional plane or deviating from a Euclidean two-dimensional plane only by variations caused by surface bowing and/or surface roughness of a magnitude inherently present in commercially available semiconductor substrates.

The substrate semiconductor layer 10 can include a single crystalline semiconductor material, a polycrystalline semiconductor material, and/or an amorphous semiconductor material. In one embodiment, the substrate semiconductor layer 10 can be a single crystalline semiconductor material layer. In one embodiment, the substrate semiconductor layer 10 can include a single crystalline silicon layer, a single crystalline silicon-germanium alloy layer, or a single crystalline silicon-carbon alloy layer. Alternately or additionally, the substrate semiconductor layer 10 can include a polycrystalline silicon layer, a polycrystalline silicon-germanium alloy layer, or a polycrystalline silicon-carbon alloy layer. Portions of the substrate semiconductor layer 10 can be suitably doped with p-type dopants (e.g., the semiconductor layer 10 may be a p-well region in the substrate 8) or n-type dopants.

The optional first electrodes 12 include a doped semiconductor material. The first electrodes 12 can be formed as doped portions of the substrate semiconductor layer 10, i.e., by doping portions of the substrate semiconductor layer 10 with p-type dopants or n-type dopants. In one embodiment, the first electrodes 12 can be formed as source regions or drain regions for monolithic three-dimensional NAND string memory devices to be subsequently formed. The first electrodes 12 may be suitably patterned to be electrically shorted to neighboring first electrodes 12 along one direction and/or electrically isolated from neighboring first electrodes 12 along another direction in an array configuration for the monolithic three-dimensional NAND string memory devices. Alternatively, the source or drain regions in the substrate may be formed at a later step in the process by ion implantation through a back side opening, as will be described in more detail below. While embodiments employing a semiconductor substrate for the substrate 8 are illustrated herein, embodiments employing non-semiconductor substrates are also contemplated herein, provided that the first electrodes 12 including a conductive material (which may be doped semiconductor material) can be formed in, or on, a non-semiconductor substrate.

Optionally, select gate electrodes (not shown) can be formed within, or on top of, the substrate semiconductor layer 10 employing previously known methods, or methods yet to be invented, for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

In one embodiment, a top surface of each first electrode 12 can be physically exposed at the front side (upper side) of the substrate 8. Alternatively, a protective film (not shown), such as a silicon dioxide layer, may be provided on the top surface of the substrate 8 in order to provide temporary protection for the substrate semiconductor layer 10 and/or the first electrodes 12.

Figure 1B:
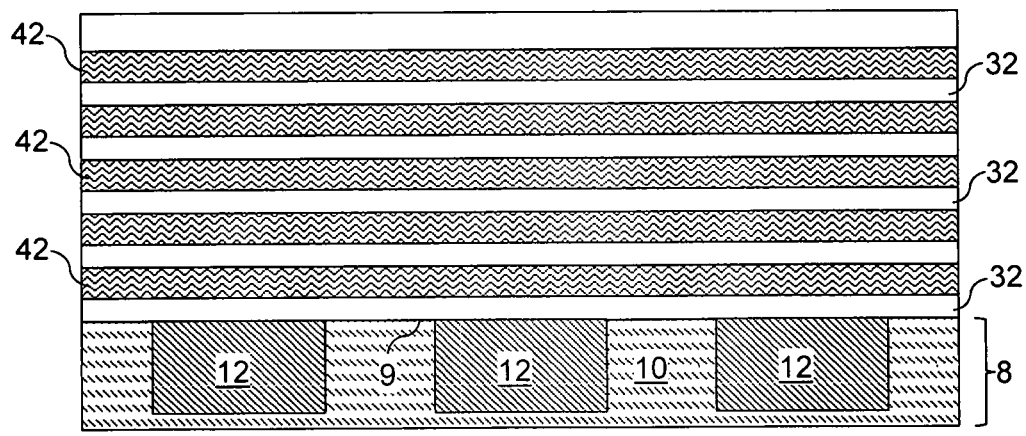

Referring to FIG. 1B, a stack of alternating layers of a first material and a second material different from the first material is formed over the substrate 8. The stack of the alternating layers is herein referred to as an alternating stack (32, 34). In one embodiment, the alternating stack (32, 42) can include first material layers 32 composed of the first material, and second material layers 42 composed of a second material different from that of first material layers 32. The second material layers may comprise electrically conductive material which forms the control gate electrodes of the NAND string. Alternatively, the second material layers 42 may comprise electrically insulating or conductive sacrificial layers which are removed through the back side openings and replaced with metal control gate electrodes.

The first material can be at least one electrically insulating material. As such, each first material layer 32 can be an insulating material layer. Electrically insulating materials that can be employed for the first material layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The second material layers 42 can function as control gate electrodes made of at least one conductive material. In this case, each second material layer 42 can be a conductive material layer. Conductive materials that can be employed for the second material layers 42 that constitute the control gate electrodes include, but are not limited to, a doped semiconductor material, elemental metals, intermetallic alloys, conductive nitrides of at least one elemental metal, a silicate of at least one metal, conductive carbon allotropes, organic conductive materials, and combinations thereof. For example, the second material can be doped polysilicon, tungsten, tungsten nitride, tantalum, tantalum nitride, titanium, titanium nitride, cobalt, copper, aluminum, an alloy thereof, or a combination thereof. Alternatively, the second material layers 42 may comprise sacrificial layers, such as silicon nitride or polysilicon sacrificial layers. In this case, at least one, and/or each, of the second material layers 42 can be a sacrificial material layer. In an illustrative example, the second material layers 42 can be silicon nitride layers that can be subsequently removed, for example, by a wet etch employing phosphoric acid.

In one embodiment, the first material layers 32 can include silicon oxide, and second material layers can include silicon nitride sacrificial layers or doped polysilicon or doped amorphous silicon layers that can be subsequently converted into doped polysilicon through a thermal anneal at an elevated temperature. The first material of the first material layers 32 can be deposited, for example, by chemical vapor deposition (CVD). For example, if silicon oxide is employed for the first material layers 32, tetraethyl orthosilicate (TEOS) can be employed as the precursor material for the CVD process. The second material of the second material layers 42 can be formed, for example, by physical vapor deposition (PVD; sputtering), chemical vapor deposition, electroplating, electroless plating, or combinations thereof.

The second material layers 42 can be suitably patterned to function as the control gate electrodes of the monolithic three-dimensional NAND string memory devices to be subsequently formed. Each second material layer 42 may comprise a portion having a strip shape extending substantially parallel to the major surface 9 of the substrate 8.

The thicknesses of the first material layers 32 and the second material layers 42 can be in a range from 8 nm to 128 nm, although lesser and greater thicknesses can be employed for each first material layer 32 and for each control gate electrode 42. In one embodiment, the thicknesses of the first material layers 32 and the second material layers 42 can be in a range from 20 nm to 50 nm. The number of repetitions of the pairs of a first material layer 32 and a second material layer (e.g., control gate electrode or sacrificial material) 42 can be in a range from 2 to 1,024, and typically from 8 to 256, although a greater number of repetitions can also be employed. The top and bottom gate electrodes in the stack may function as the select gate electrodes.

Figure 1C:
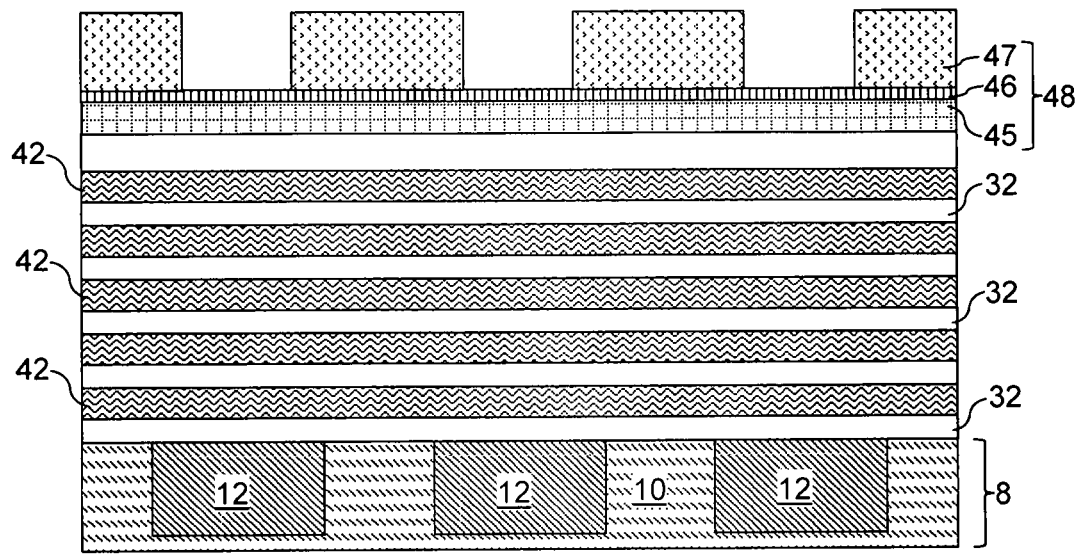

Referring to FIG. 1C, a lithographic material stack 48 can be formed over the top surface of the alternating stack (32, 42). The lithographic material stack 48 can include, for example, an organic planarization layer (OPL) 45, such as amorphous carbon, an antireflective coating (ARC) layer 46, and a photoresist layer 47. The photoresist layer 47 can be lithographically patterned, for example, by lithographic exposure and development, to form openings therein. The pattern of the openings corresponds to the areas of memory openings to be subsequently formed through the alternating stack (32, 42). For example, the pattern of the openings in the patterned photoresist layer 47 can be circular, elliptical, polygonal, or of a closed curvilinear shape. As used herein, a "closed" shape refers to a two-dimensional shape that is defined by a contiguous periphery that begins and ends at a same point without crossing itself, i.e., a shape defined by a periphery that can be traced throughout the entirety of the periphery to come back to the starting point without crossing any portion of the periphery during the tracing.

In one embodiment, each shape for an opening in the photoresist layer 47 (and the corresponding shape for a memory opening to be subsequently formed) can be identical, or can be related to a neighboring shape through symmetry. In this case, the pattern of the opening in the photoresist layer 47 can be a periodic pattern. In one embodiment, the shapes of the openings in the patterned photoresist layer 47 can be substantially circular or substantially elliptical. In one embodiment, the sizes (e.g., a diameter or a major axis) of the openings in the patterned photoresist layer 47 can be in a range from 30 nm to 300 nm, although lesser and greater dimensions can also be employed. A hard mask layer (not shown) may be optionally employed, for example, between the lithographic material stack 48 and the top surface of the alternating stack (32, 42). While an embodiment in which the lithographic material stack 48 includes an organic planarization layer (OPL) 45, an ARC layer 46, and a photoresist layer 47 is illustrated herein, any alternative lithographic material layer (e.g., photoresist) or any alternative lithographic material stack can be employed in lieu of the lithographic material stack 48 illustrated herein.

Figure 1D:
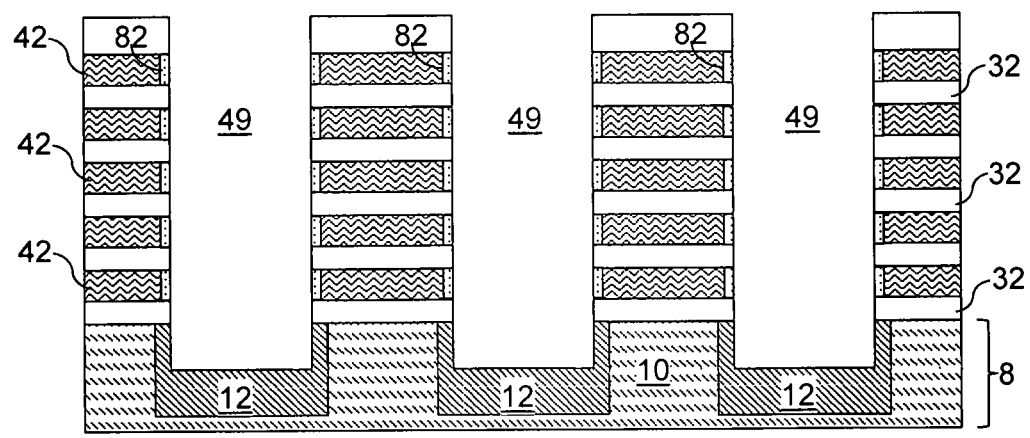

Referring to FIG. 1D, the pattern in the patterned photoresist layer 47 can be transferred through the ARC layer 46 and the OPL 45, and subsequently through the entirety of the alternating stack (32, 42) by at least one anisotropic etch that employs the patterned photoresist layer 47, and/or any patterned portion of the ARC layer 46 and the OPL 45, and/or any patterned portion of a hard mask layer, if present, as an etch mask. A plurality of etch chemistries may be employed to etch through the various materials of the ARC layer 46, the OPL 45, the optional hard mask layer, and the alternating stack (32, 42).

Portions of the alternating stack (32, 42) underlying the openings in the photoresist layer 45 are etched to form memory openings 49. In other words, the transfer of the pattern in the photoresist layer 47 through the alternating stack (32, 42) forms the memory opening 49 through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, a sacrificial etch stop layer (not shown) may be employed between the alternating stack (32, 42) and the substrate 8. The sidewalls of the memory openings 49 can be substantially vertical, or can be tapered.

In one embodiment, a surface dielectric portion 82 can be formed by converting a surface portion of each second material layer 42 that is physically exposed to a memory opening 49 into a dielectric material portion. For example, after etching through a bottommost layer 42 within the alternating stack (32, 42), an oxidation process, a nitridation process, or an oxynitridation process can be performed to convert the surface portions of the second material layers 42 that are physically exposed to the memory opening 49 into dielectric oxide portions, dielectric nitride portions, or dielectric oxynitrides portions. The conversion of the surface portions of the second material layers 42 into the surface dielectric portions 82 can be performed by a thermal oxidation process, a thermal nitridation process, a thermal oxynitridation process, a plasma oxidation process, a plasma nitridation process, a plasma oxynitridation process, or a combination thereof. In one embodiment, the conversion of the surface portions of the second material layers 42 into the surface dielectric portions 82 can be performed by in-situ steam generation oxidation process. For example, the surface portions 82 of silicon nitride sacrificial layers 42 may be converted to silicon oxide or silicon oxynitride.

The thickness of the surface dielectric portions 82 can be in a range from 0.5 nm to 10 nm, although lesser and greater thicknesses can also be employed. Any remaining portion of the bottommost first material layer 32 underneath each memory opening 49 is subsequently etched so that the memory openings 49 extend from the top surface of the alternating stack (32, 42) to the top surface of the first electrodes 12 or the substrate semiconductor layer 10. Remaining portions of the lithographic material stack 48 (and optionally remaining portions of a hard mask layer, if present) can be subsequently removed selective to the materials of the alternating stack (32, 42). As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. In one embodiment, the openings in the photoresist layer 45 and the memory openings 49 can overlie the first electrodes 12 or the major surface 9 of the substrate 8.

As used herein, a first element "overlies" a second element if a first horizontal plane including the bottommost point of the first element is within, or above, a second horizontal plane including a topmost point of the second element and if there exits an areal overlap between the area of the first element and the area of the second element in a see-through view along a direction perpendicular to the first and second horizontal planes. If a first element overlies a second element, the second element "underlies" the first element. In one embodiment, the entire area of a memory opening 49 can be within the area of an underlying first electrode 12 or the substrate semiconductor layer 10.

In one embodiment, an overetch into the first electrodes 12 or the substrate semiconductor layer 10 can be optionally performed after the top surfaces of the first electrodes 12 or the substrate semiconductor layer 10 are physically exposed. The overetch may be performed prior to, or after, removal of the lithographic material stack 48. The overetch can be an anisotropic etch, and recesses the physically exposed portions of the top surfaces of the first electrodes 12 or the substrate semiconductor layer 10 underlying the memory openings by a recess depth. In other words, the recessed surfaces of the first electrodes 12 or the substrate semiconductor layer 10 can be vertically offset from the undressed top surfaces of the first electrodes 12 or the substrate semiconductor layer 10 by the recess depth. The recess depth can be, for example, in a range from 1 nm to 50 nm, although lesser and greater recess depths can also be employed. The overetch is optional, and may be omitted. In this case, the bottom surface of each memory opening 49 can be coplanar with the topmost surface of the first electrodes 12, and/or the topmost surface of the substrate 8.

Each of the memory openings 49 can include a sidewall (or a plurality of sidewalls) that extends substantially perpendicular to the major surface of the substrate 8 and is defined by the physically exposed sidewall surfaces of the alternating stack (32, 42, 82). Each of the memory openings 49 can further include a bottom surface that is a top surface of a first electrode 12 or the substrate semiconductor layer 10. In one embodiment, the sidewalls of the first electrodes 12, which are present around the recesses within the first electrodes 12, can be vertically coincident with the sidewalls of the memory openings 49. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 1E:
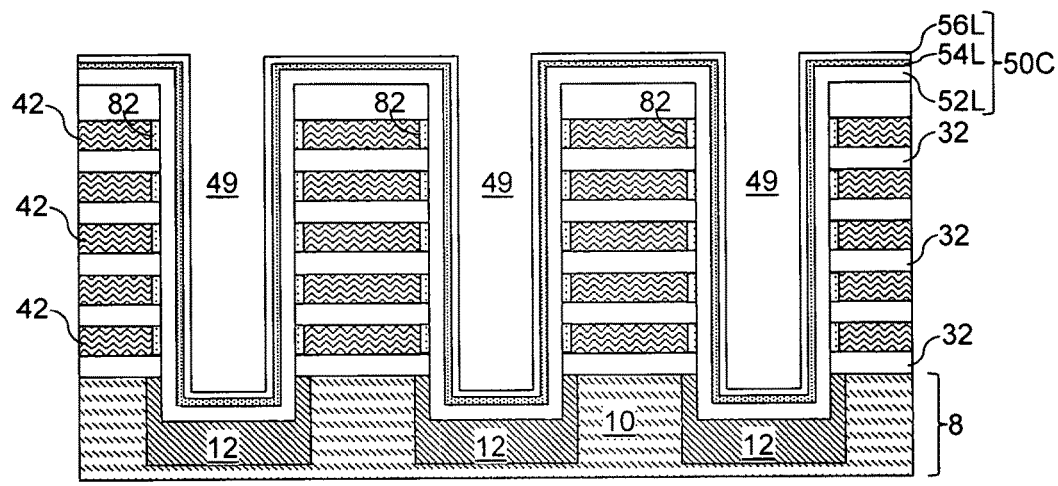

Referring to FIG. 1E, a memory film layer 50C is formed in the memory openings and over the alternating stack (32, 42). The memory film layer 50C can be a stack of contiguous material layers that overlie the entirety of the alternating stack (31, 42, 82). The memory film layer 50C contacts all sidewall surface(s) and all bottom surface(s) of the memory openings 49. The memory film layer 50C is a contiguous film stack that provides the functionality of charge storage in the absence of an external electrical bias voltage, while enabling charge transfer in the presence of a suitable external electrical bias voltage.

In one embodiment, the memory film layer 50C can be a stack, in the order of formation, of a blocking dielectric layer 52L, a charge storage layer 54L, and a tunnel dielectric layer 56L. The blocking dielectric layer 52L contacts the sidewalls of the memory openings 49. Specifically, the blocking dielectric layer 52L can contact the sidewalls of the surface dielectric portions 82, or in the absence of the surface dielectric portions 82, can contact the sidewalls of the second material layers 42. The blocking dielectric layer 52L may include one or more dielectric material layers that can function as the dielectric material(s) of a control gate dielectric between the second material layers 42 and charge storage regions to be subsequently formed out of the charge storage layer 54L. The blocking dielectric layer 52L can include silicon oxide, a dielectric metal oxide, a dielectric metal oxynitride, or a combination thereof. In one embodiment, the blocking dielectric layer 52L can include a stack of at least one silicon oxide layer and at least one dielectric metal oxide layer. The blocking dielectric layer 52L can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer 52L can be in a range from 6 nm to 24 nm, although lesser and greater thicknesses can also be employed. Alternatively, the blocking dielectric layer 52L may be omitted from the memory opening 49, and instead be formed through the back side opening in back side recesses left by the removal of the sacrificial layers 42 prior to forming the metal control gate electrodes through the back side opening.

The charge storage layer 54L includes a dielectric charge trapping material, which can be, for example, silicon nitride, or a conductive material such as doped polysilicon or a metallic material. In one embodiment, the charge storage layer 54L includes silicon nitride. The charge storage layer 54L can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54L may comprise an insulating charge trapping material, such as one or more silicon nitride segments. Alternatively, the charge storage layer 54L may comprise conductive nanoparticles such as metal nanoparticles, which can be, for example, ruthenium nanoparticles. The charge storage layer 54L can be formed, for example, by chemical vapor deposition (CVD), atomic layer deposition (ALD), physical vapor deposition (PVD), or any suitable deposition technique for the selected material(s) for the charge storage layer 54L. The thickness of the charge storage layer can be in a range from 2 nm to 20 nm, although lesser and greater thicknesses can also be employed.

The tunnel dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56L can include a stack of a first silicon oxide layer, a silicon oxynitride layer, and a second silicon oxide layer, which is commonly known as an ONO stack. In one embodiment, the tunneling dielectric layer 56L can include a silicon oxide layer that is substantially free of carbon or a silicon oxynitride layer that is substantially free of carbon. The thickness of the tunnel dielectric layer 56L can be in a range from 2 nm to 20 nm, although lesser and greater thicknesses can also be employed.

Figure 1F:
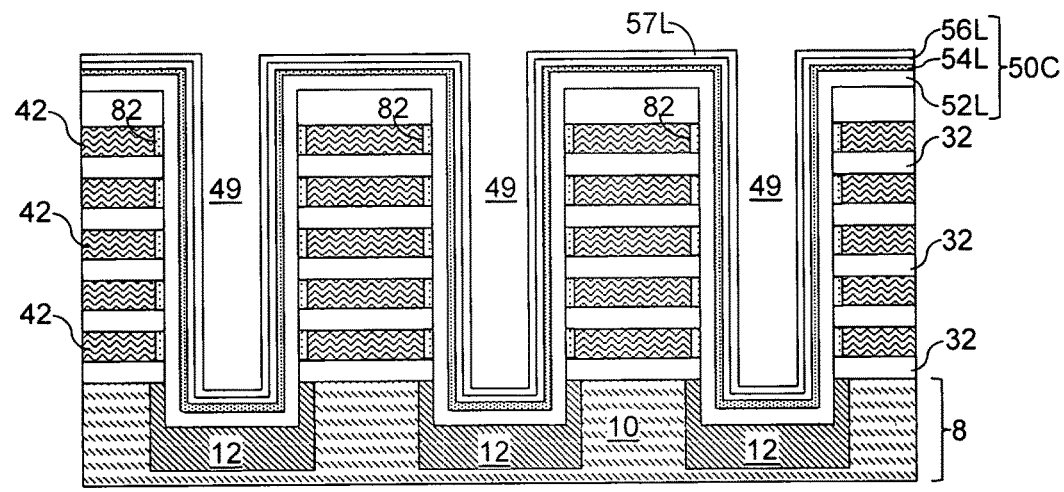

Referring to FIG. 1F, a sacrificial material layer 57L can be formed on the memory film layer 50C. The sacrificial material layer 57L includes a material that is different from the material of the innermost layer of the tunnel dielectric layer 56L within the memory openings 49 (which is the same as the topmost layer of the tunnel dielectric layer 56L over the alternating stack (32, 42, 82)) so that the sacrificial material layer 57L can be subsequently removed selective to the tunnel dielectric layer 56L. The materials that can be employed for the sacrificial material layer 57L include, but are not limited to, a chemical vapor deposition (CVD) silicon oxide, silicon nitride, a semiconductor material, organosilicate glass, an organic polymer, an inorganic polymer, amorphous carbon, and a diamond-like carbon. As used herein, a CVD silicon oxide refers to a silicon oxide material formed by chemical vapor deposition employing a carbon-including precursor (such as tetraethyl orthosilicate) and inherently includes carbon as impurity at an atomic concentration of at least 0.1%, and typically in a range from 0.2% to 1.0%. In one embodiment, the sacrificial material layer 57L includes a dielectric material. In one embodiment, the sacrificial material layer 57L includes a material other than a semiconductor material. In one embodiment, the sacrificial material layer 57L includes a material other than a silicon-containing semiconductor material.

In an exemplary non-limiting embodiment, the innermost layer of the tunnel dielectric layer 56L within the memory openings 49 can be silicon oxynitride obtained by oxidation of silicon nitride (for example, by thermal conversion of silicon nitride by in-situ steam generation oxidation process), and the sacrificial material layer 57L can include a low temperature oxide (LTO), which is a CVD silicon oxide obtained by a plasma enhanced chemical vapor deposition (PECVD) employing tetraethyl orthosilicate (TEOS) as a precursor. Typical deposition temperatures of the LTO can be in a range from 25° C. to 200° C. Due to the absence of nitrogen atoms in the CVD silicon oxide, and due to a lower density of the CVD silicon oxide relative to the silicon oxynitride material of the tunnel dielectric layer 56L, the CVD silicon oxide of the sacrificial material layer 57L can be removed selective to the material of the tunnel dielectric layer 56L in a subsequent processing step with a high selectivity, which can be significantly greater than 2.

In another exemplary non-limiting embodiment, the innermost layer of the tunnel dielectric layer 56L within the memory openings 49 can be silicon oxide or silicon oxynitride obtained by oxidation of silicon nitride (for example, by thermal conversion of silicon nitride by in-situ steam generation oxidation process), and the sacrificial material layer 57L can include silicon nitride deposited by low pressure chemical vapor deposition (LPCVD), plasma enhanced chemical vapor deposition (PECVD), or atomic layer deposition (ALD). For example, silicon nitride deposited by a chemical vapor deposition process employing hexachlorodisilane as a silicon precursor can be employed as the material of the sacrificial material layer 57L.

The sacrificial material layer 57L can be conformally, or non-conformally, deposited. The thickness of the sacrificial material layer 57L, as measured near a bottom end of a vertical portion of the sacrificial material layer 57L within a memory opening 49, can be in a range from 2 nm to 30 nm, although lesser and greater thicknesses can also be employed. In one embodiment, the sacrificial material layer 57L can be conformally deposited.

Figure 1G:
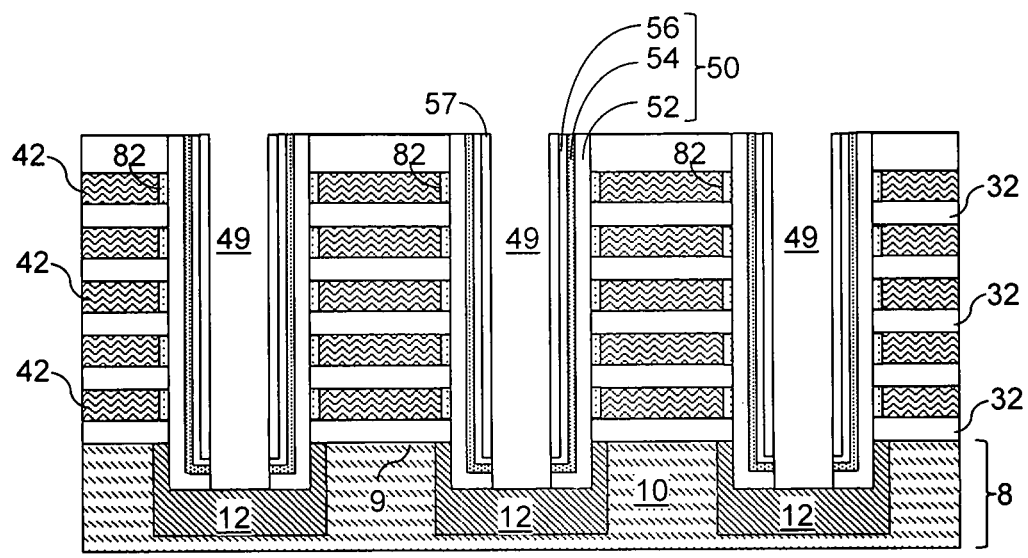

Referring to FIG. 1G, horizontal portions of the sacrificial material layer 57L and the memory film layer 50C are etched to physically expose portions of the top surface of the substrate 8 underneath each memory opening 49, while a vertical portion of the sacrificial material layer 57 is present on each vertical portion of the memory film layer 50C. Specifically, an anisotropic etch can be employed to etch the horizontal portions of the sacrificial material layer 57L and the memory film layer 50C from above the alternating stack (32, 42, 82), and to etch each horizontal portion of the sacrificial material layer 57L and the memory film layer 50C at the bottom of each memory opening 49. The vertical portions of the sacrificial material layer 57L covers and protects the vertical portions of the memory film layer 57 during the anisotropic etch from the reactive ions that are present within the plasma of etchant gases.

After the anisotropic etch, the remaining portions of the sacrificial material layer 57L and the memory film layer 50C are divided into disjoined material portions (50, 57). Each disjoined material portion (50, 57) is located within a memory opening 49 (See FIG. 1D), and includes a memory film 50 and a sacrificial material layer 57. Each memory film 50 can include an optional blocking dielectric 52 which is a remaining portion of the blocking dielectric layer 52L, a charge storage region 54 which is a remaining portion of the charge storage layer 54L, and a tunnel dielectric 56 which is a remaining portion of the tunnel dielectric layer 56L.

Each memory film 50 includes a remaining contiguous vertical portion of the memory film layer 50C (See FIG. 1F) that is located within a memory opening 49, and each sacrificial material layer 57 can be a remaining contiguous vertical portion of the sacrificial material layer 57L (See FIG. 1F). Each memory film 50 can be homeomorphic to a torus, and each sacrificial material layer 57 can be homeomorphic to a torus. As used herein, an element is homeomorphic to a geometrical shape if the shape of the element can be mapped to the geometrical shape by continuous deformation without creation or destruction of any hole. In one embodiment, each sacrificial material layer 57 can have a cylindrical shape, and each memory film 50 can have a shape that is modified from a cylindrical shape by the addition of an annulus that underlies an overlying sacrificial material layer 57 and replicates the horizontal cross-sectional shape of the overlying sacrificial material layer 57.

If the first electrodes 12 underlie the memory openings 49, a top surface of a first electrode 12 can be physically exposed within the cavity defined by the inner sidewalls of an overlying sacrificial material layer 57. In one embodiment, within each region including a memory opening 49 (which is defined by the outer sidewalls of a memory film 50), a sacrificial material layer 57 can have an inner sidewall that is vertically coincident with a sidewall a horizontal portion of a memory film 50. Each sacrificial material layer 57 covers, and protects, the memory film 50 that contacts the sacrificial material layer 57 during the anisotropic etch that physically exposes the surfaces of the first electrodes 12. Specifically, the inner vertical surfaces of each tunnel dielectric 56 is protected by a sacrificial material layer 57 during the anisotropic etch that physically exposed the surfaces of the first electrodes 12 so that the quality of the tunnel dielectric 56 is not degraded during the anisotropic etch.

Figure 1H:
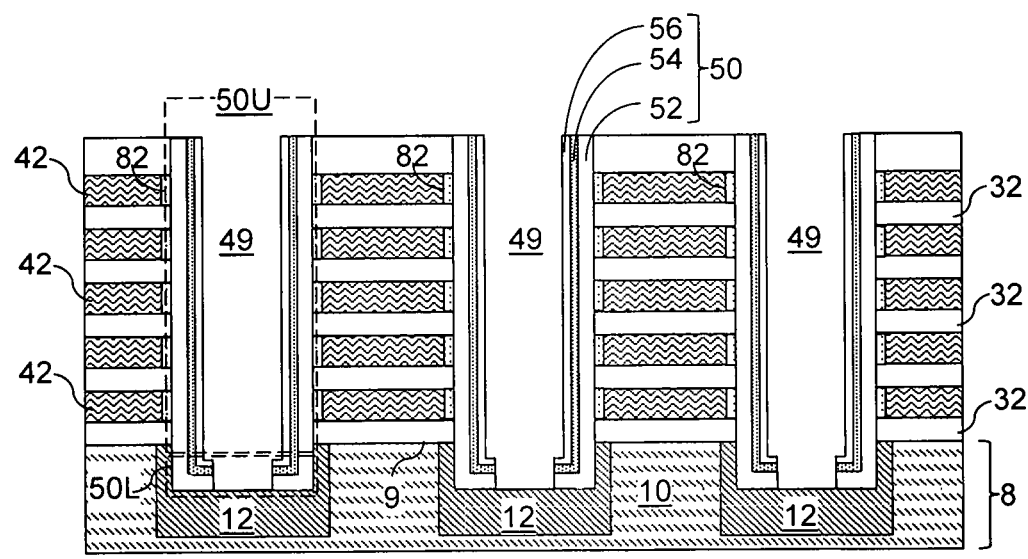

Referring to FIG. 1H, the sacrificial material layers 57 are removed selective to the memory films 50 and the first electrodes 12 or the substrate semiconductor layer 10 by an etch. The etch can be an isotropic etch such as a wet etch or an isotropic dry etch. The chemistry of the etch can be selected to obtain a high selectivity with respect to the outermost material of the memory films 50.

In an exemplary non-limiting embodiment, the innermost layer of the tunnel dielectrics 56 can be silicon oxynitride obtained by oxidation of silicon nitride (for example, by thermal conversion of silicon nitride by in-situ steam generation oxidation process), the sacrificial material layers 57 can include low temperature oxide, and the removal of the sacrificial material layers 57 can be performed by a wet etch employing a dilute hydrofluoric (HF) acid and/or by a dry etch employing hydrofluoric acid vapor to provide high selectivity to the memory films 50. In general, dilute hydrofluoric acid and hydrofluoric acid vapor provide high selectivity for the etching of low temperature oxide with respect to silicon oxynitride due to the presence of nitrogen atoms within the silicon oxynitride.

In another exemplary non-limiting embodiment, the innermost layer of the tunnel dielectric layers 56 can be silicon oxide or silicon oxynitride obtained by oxidation of silicon nitride (for example, by thermal conversion of silicon nitride by in-situ steam generation oxidation process), and the sacrificial material layers 57 can include silicon nitride, and the removal of the sacrificial material layers 57 can be performed by a wet etch employing phosphoric acid. In general, phosphoric acid provides high selectivity during the etch of silicon nitride with respect to silicon oxynitride or silicon oxides. Alternatively, a substantially isotropic dry etch employing at least one hydrofluorocarbon gas or at least one hydrochlorocarbon gas may be employed to remove silicon nitride selective to silicon oxynitride or silicon oxide.

In general, the etch chemistry for removal of the sacrificial material layers 57 can be selected such that collateral removal of the tunneling dielectrics 56 can be minimized, i.e., to maximize the selectivity of the etch process with respect to the innermost material of the tunneling dielectrics 56. Due to the presence of the sacrificial material layers 57 during removal of physically exposed horizontal portions of the memory film layer 50C, the inner sidewalls of the upper portion 50U of each memory film 50 that extend vertically throughout the alternating stack (32, 42, 82) are laterally offset outward from the inner sidewalls of the lower portion 50L of the memory film 50 by a uniform distance. The uniform distance is invariant along the inner sidewalls of the lower portion 50L of the memory film 50. The uniform distance is the thickness of the bottom portion of the sacrificial material layer 57 (See FIG. 1G) that is removed from within the memory film 50.

Figure 1I:
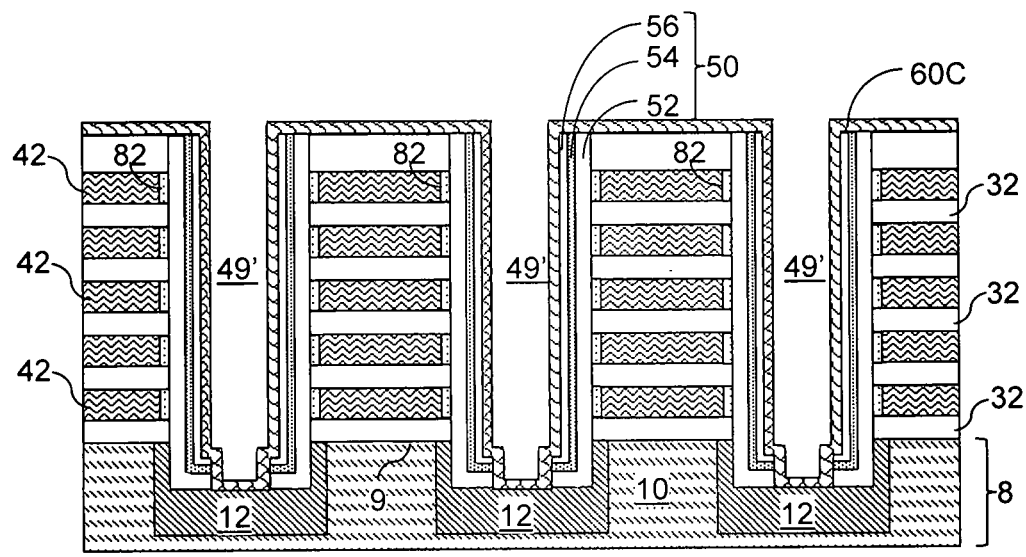

Referring to FIG. 1I, a semiconductor material layer 60C can be deposited directly on a top surface of the each first electrode 12 or the substrate semiconductor layer 10, directly on inner sidewalls of the memory films 50, and over the alternating stack (32, 42). The semiconductor material layer 60C is deposited directly on the first electrodes 12 or on the semiconductor substrate 8. The semiconductor material layer 60C may, or may not, be deposited conformally. In one embodiment, the semiconductor material layer 60C can be deposited conformally, i.e., with substantially the same thickness throughout.

The semiconductor material layer 60C includes a polycrystalline semiconductor material or an amorphous semiconductor material that can be subsequently annealed at an elevated temperature to form a polycrystalline semiconductor material. Semiconductor materials that can be employed for the semiconductor material layer 60C include, but are not limited to, silicon, germanium, a silicon-germanium alloy, a silicon-carbon alloy, a silicon-germanium-carbon alloy, a III-V compound semiconductor material, a II-VI compound semiconductor material, an organic semiconductor material, or a combination thereof. The semiconductor material layer 60C can be formed by a conformal deposition process such as chemical vapor deposition (CVD) or atomic layer deposition (ALD). The thickness of the semiconductor material layer 60C, as measured on a sidewall of a memory film 50, can be in a range from 3 nm to 30 nm, although lesser and greater thicknesses can also be employed. In one embodiment, thickness of the semiconductor material layer 60C can be in a range from 6 nm to 15 nm.

The semiconductor material layer 60C can include a semiconductor material. As discussed above, the semiconductor material layer 60C may be intentionally doped, or unintentionally doped. Unintentional doping of the semiconductor material layer 60C may occur, for example, by residual electrical dopants that are present in a process chamber or diffuse out of the substrate 8 during formation of the semiconductor material layer 60C. The doped semiconductor material can be p-doped or n-doped, i.e., doped with p-type electrical dopants or n-type electrical dopants. The doping of the semiconductor material layer 60C can be performed in-situ, for example, by flowing at least one dopant gas concurrently or alternately with at least one precursor gas for the semiconductor material. Alternatively or additionally, the doping of the semiconductor material layer 60C can be performed ex-situ, for example, by introducing p-type dopants or n-type dopants into the semiconductor material layer 60C by ion implantation, plasma doping, and/or outdiffusion of electrical dopants from a disposable dopant source material that is subsequently removed.

Various processing steps may be optionally performed to increase the average grain size within the polycrystalline material of the semiconductor material layer 60C, either as deposited or to be subsequently formed upon annealing of a deposited amorphous material.

In one embodiment, the physically exposed surfaces of the semiconductor material layer 60C can be treated with a plasma of a non-electrical dopant. As used herein, a non-electrical dopant refers to a dopant that does not add a charge carrier to the band structure of a semiconductor material, i.e., does not add a hole within a balance band of the semiconductor material and does not add an electron within a conduction band of the semiconductor material. In one embodiment, the semiconductor material layer 60C can be treated with nitrogen plasma to passivate dangling bonds or other mobility traps for charge carriers, and to reduce the density of grain boundaries.

Additionally or alternatively, the semiconductor material layer 60C can be doped with carbon to reduce the density of grain boundaries. Carbon can be introduced into the semiconductor material layer 60C by in-situ doping at an atomic concentration in a range from 0.01% to 1.00%, although lesser and greater atomic concentrations can also be employed.

Figure 1J:
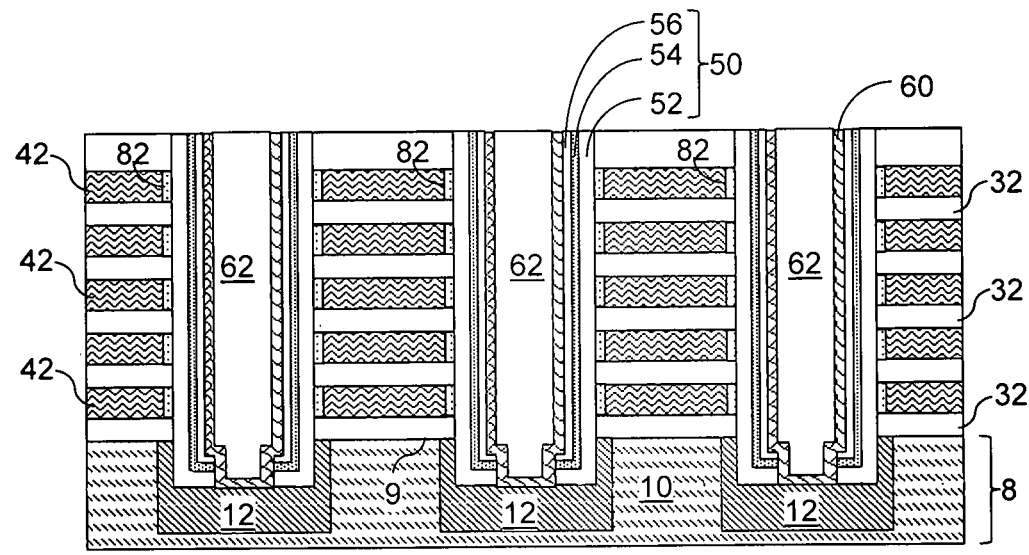

Referring to FIG. 1J, an optional core dielectric material layer 62 can be deposited within remaining cavities of the memory openings 49 and over the semiconductor material layer 60C. The core dielectric material layer includes a dielectric material such as silicon oxide, organosilicate glass (OSG), a spin-on dielectric material, or a combination thereof. In one embodiment, the core dielectric material layer includes undoped silicon oxide. The core dielectric material layer can be deposited, for example, by chemical vapor deposition and/or by spin coating. The amount of the deposited dielectric material for the core dielectric material layer is selected such that the entire cavity of each memory opening is filled with the deposited dielectric material.

The portions of the core dielectric material layer and the semiconductor material layer 60C above the top surface of the alternating stack (32, 42) can be removed, for example, by a planarization process and/or a recess etch. In one embodiment, chemical mechanical polishing (CMP) can be employed to remove the portions of the core dielectric material layer 62 and the semiconductor material layer 60C from above the top surface of the alternating stack (32, 42).

Each remaining portion of the semiconductor material layer 60C within a memory opening 49 (See FIG. 1D) constitutes a through-stack channel 60, which can be a semiconductor channel between the source and the drain of the monolithic three-dimensional NAND string memory device of the present disclosure. Each remaining portion of the core dielectric material layer constitutes a dielectric core 62, which contacts inner sidewalls of the through-stack channel 60 that laterally surrounds the dielectric core 62.

The through-stack channel 60 includes an electrically doped (i.e., p-doped or n-doped) polycrystalline material, which is polycrystalline from the time of deposition of the semiconductor material layer 60C or becomes polycrystalline after a subsequent anneal process. In one embodiment, a predominant fraction of the grains of the polycrystalline material of each through-stack channel 60 can extend from the outer surface of the through-stack channel 60 to the inner surface of the through-stack channel 60. In other words, more than 50% of the grains of the polycrystalline material of each through-stack channel 60 can include a first surface that contacts the memory film 50 and a second surface that contacts the dielectric core 60 within each grain.

The polycrystalline material within each through-stack channel 60 does not include a substantially contiguous interface containing grain boundaries located between the outer surface of the through-stack channel 60 and the inner surface of the through-stack channel 60 and extending over an entire interface between the through-stack channel 60 and the memory film 50. As used herein, an interface is "substantially contiguous" if the interface vertically extends in the channel through a substantial vertical distance, e.g., through more than two, such as more than five, such as all, of the control gate electrodes 42 within the alternating stack (32, 42). In one aspect, the total area of a discontinuity (e.g., lack of grain boundary) within the interface is sufficiently high that the number of additional defects is high enough to degrade characteristics of the cell channel, leading to degradation of mobility, cell current, sub-threshold slope, variability, boosting potential, etc. For example, in one embodiment, the total area of a discontinuity (e.g., lack of grain boundary) within the interface is 20% or less, such as zero to 10%, for example 1 to 5% of the entire area of the interface and the discontinuity. However, in other embodiments, the number total area of the discontinuity may be higher. The discontinuity may occur due to grain growth during an annealing step which may eliminate a small portion of the grain boundaries at the interface. In other words, surfaces of grain boundaries between the outer surface of the through-stack channel 60 and the inner surface of the through-stack channel 60 cannot be adjoined to form a contiguous layer extending over an entire interface between the through-stack channel 60 and the memory film 50 and not containing a hole therein. The feature of the lack of any contiguous interface made of a subset of grain boundaries located between the outer surface of the through-stack channel 60 and the inner surface of the through-stack channel 60 is the result of a single deposition process employed to form the semiconductor material layer 60C of the embodiments of the present disclosure. In other words, because the semiconductor material layer 60C is formed during a single deposition process, a stack of multiple semiconductor materials does not exist in any of the through-stack channels 60. Correspondingly, there is no contiguous interface between two material layers between the inner sidewall of a through-stack channel 60 and the outer sidewall of the through-stack channel 60.

Thus, unlike prior art structures in which a semiconductor channel is formed by multiple deposition processes and inherently includes a contiguous interface of a large number of grain boundaries and/or defects that extends over the entire area of the interface between a semiconductor channel and a memory film, the through-stack channel 60 of the present disclosure does not include any contiguous interface of a large number of grain boundaries and/or defects that runs parallel to the interface between the through-stack channel 60 and the memory film 50. By forming the semiconductor material layer 60C employing a single deposition process in the embodiments of the present disclosure, the through-stack channel 60 of the present disclosure can provide lesser grain boundaries and higher conductivity than prior art semiconductor material layers having similar overall dimensions and similar material compositions.

Figure 1K:
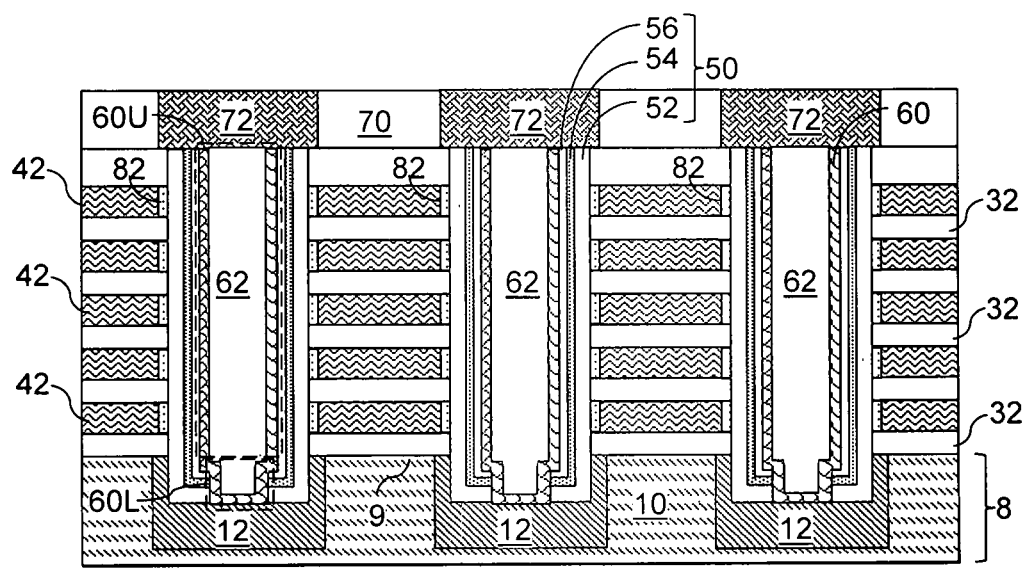

Referring to FIG. 1K, a top dielectric layer 70 can be formed over the alternating stack (32, 42, 82), the memory films 50, the through-stack channels 60, and the dielectric cores 62. The top dielectric layer 70 includes a dielectric material such as silicon oxide, silicon nitride, organosilicate glass, or a combination thereof. The top dielectric layer 70 can be deposited, for example, by chemical vapor deposition. The thickness of the top dielectric layer 70 can be in a range from 30 nm to 1,000 nm, although lesser and greater thicknesses can also be employed.

Openings can be made through the top dielectric layer 70 in regions that overlies the through-stack channels 60. In one embodiment, the openings can be made to encompass each contiguous area including an adjoining pair of a through-stack channel 60 and a dielectric core 62. In one embodiment, the openings through the top dielectric layer 70 can be made by applying a photoresist layer (not shown) over the top dielectric layer 70, lithographically patterning the photoresist layer 70, an etching portions of the top semiconductor layer 70 that are not covered by the remaining portions of the photoresist layer. Top surfaces of the through-stack channels 60 are physically exposed at the bottom of the openings through the top dielectric layer 70. The photoresist layer can be removed, for example, by ashing.

A conductive or semiconductor material is deposited into the openings in the top dielectric layer 70, for example, by physical vapor deposition, chemical vapor deposition, electroplating, electroless plating, or a combination thereof. The conductive material is planarized so that the portion of the conductive material above the top surface of the top dielectric layer 70 is removed. The planarization of the conductive material can be performed, for example, by chemical mechanical polishing (CMP). Each remaining portion of the conductive material constitutes a second electrode 72. Each pair of a first electrode 12 and a second electrode 72 electrically shorted to the same through-stack channel 60 can function as a pair of a source region and a drain region for a monolithic three-dimensional NAND string memory device. A first electrode 12 (which can be a doped semiconductor portion) can function as a source region, and a second electrode 72 (which can be another doped semiconductor portion) can function as a drain region within a monolithic three-dimensional NAND string memory device, or vice versa. Alternatively, the top portion of the channel 60 is doped by ion implantation to form a drain or source region therein. Electrical contacts and interconnects are then formed to the electrodes/source/drain regions 12, 72.

The first exemplary device structure illustrated in FIG. 1K is a three-dimensional memory device that includes a substrate 8 having a major surface 9, and an alternating stack (32, 42, 82) of insulating material layers composed of the first material layers 32 and control gate electrodes composed of the second material layers 42 located over the substrate 8. The alternating stack has a memory opening 49 (See FIG. 1D) extending through the alternating stack (32, 42, 83) in a direction substantially perpendicular to the major surface 9. The first exemplary device structure further includes a memory film 50 located at a peripheral region of the memory opening 49, and a semiconductor channel embodied as the through-stack channel 60. The through-stack channel 60 includes an upper portion 60U extending substantially perpendicular to the major surface 9 and contacting an inner sidewall of the memory film 50 and a lower portion 60L contacting a single crystalline semiconductor material portion located within, or on, the substrate 8.

A sidewall of the upper portion 60U of the semiconductor channel can be laterally offset with respect to a sidewall of the lower portion 60L of the semiconductor channel. Specifically, an outer sidewall of the upper portion 60U of the semiconductor channel (i.e., the through-stack channel 60) in contact with a first portion of the memory film 50 is laterally offset with respect to an outer sidewall of the lower portion 60L of the semiconductor channel in contact with a second portion of the memory film 50. An inner sidewall of the upper portion 60U of the semiconductor channel (i.e., the through-stack channel 60) in contact with a first portion of a dielectric core 62 is laterally offset with respect to an inner sidewall of the lower portion 60L of the through-stack channel in contact with a second portion of the dielectric core 62. As used herein, a first sidewall is laterally offset from a second sidewall if there is no vertical plane that can include the first sidewall and the second sidewall.

Because the through-stack channel 60 is formed by a single semiconductor material layer deposition, the through-stack channel 60 does not include a contiguous interface extending along the vertical direction, i.e., along a direction parallel to an outer surface of the through-stack channel 60. In other words, a substantially contiguous surface composed of grain boundaries, and different from the outer surface of the through-substrate channel 60, does not exist within the semiconductor channel. For this reason, the semiconductor channel made of the through-stack channel 60 does not include a substantially contiguous interface vertically extending through any substantial vertical distance, e.g., through more than two, such as more than five, such as all, of the control gate electrodes 42 within the alternating stack (32, 42). Thus, the semiconductor channel does not include a substantially contiguous interface composed of grain boundaries, not contacting the memory film 50, and vertically extending through the control gate electrodes 42.

In one embodiment, the memory film 50 can include a stack containing, from one side to another, a blocking dielectric 52, a charge storage region 54, and a tunneling dielectric 56. In one embodiment, a blocking dielectric 52 and/or tunneling dielectric 56 can be comprised of one or more dielectric films made of different materials. In one embodiment, the single crystalline semiconductor material portion can be a doped semiconductor material portion of substrate 8. The single crystalline semiconductor material portion can be, for example, a first electrode 12.

In one embodiment, an outer sidewall of the upper portion 60U of the semiconductor channel (i.e., the through-stack channel 60) can extends farther outward from a geometrical center of the memory opening 49 (e.g., the vertical axis in the center of opening 49) than an outer sidewall of the lower portion 60L of the semiconductor channel.

A dielectric core 62 can be embedded within the memory film 50. A first interface between the dielectric core 62 and the upper portion 60U of the semiconductor channel (i.e., the through-stack channel 60) can be laterally offset from a second interface between the dielectric core 62 and the lower portion 60L of the semiconductor channel.

Figure 1L:
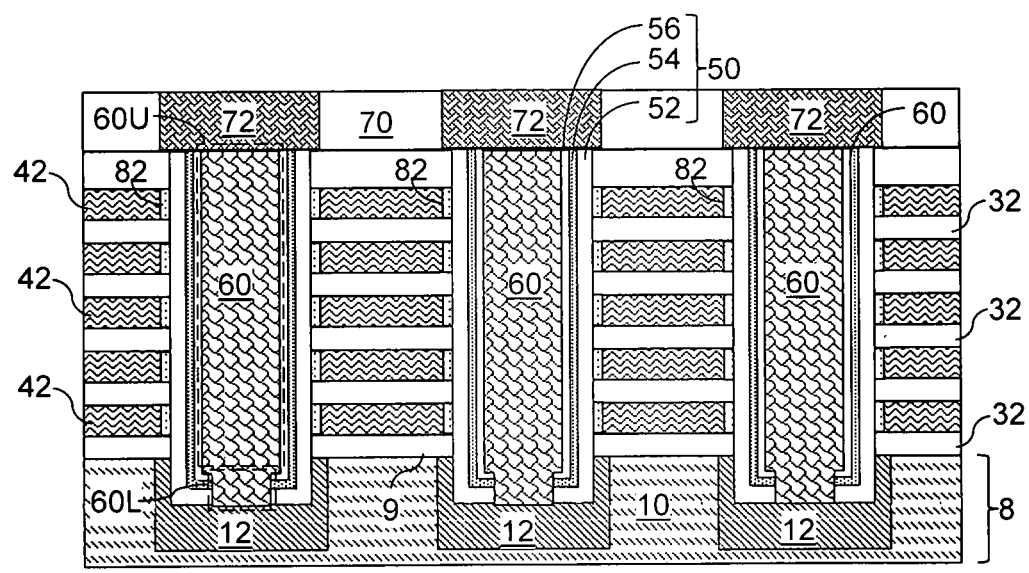
FIG. 1L is a vertical cross-sectional view of a first variation of the first exemplary device structure according to the first embodiment of the present disclosure.

Referring to FIG. 1L, a first alternative structure for the first exemplary device structure is illustrated. In this embodiment, the dielectric core 62 is omitted and the thickness of the semiconductor channel layer 60C is such that the entirety of each cavity within the memory openings 49 is filled with the semiconductor material layer 60C as deposited. Through-stack channels 60 can be formed by subsequent removal of the portion of the semiconductor material layer 60C from above the horizontal plane including top surface of the alternating stack (32, 42, 82). Each of through-stack channels 60 can be topologically homeomorphic to a sphere. Subsequently, the processing steps of FIG. 1K can be performed to provide the first variation of the first exemplary device structure illustrated in FIG. 1L.

Figure 1M:
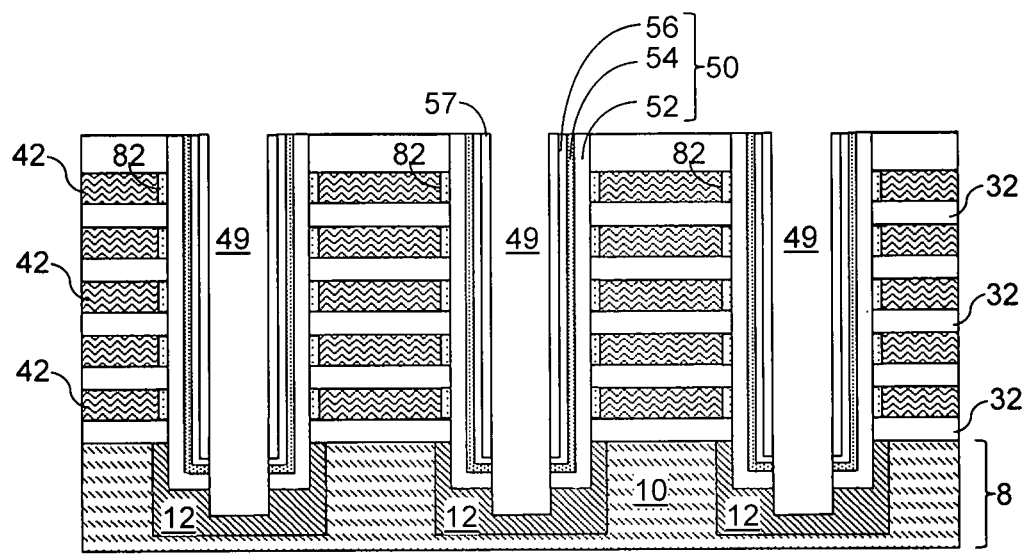
FIGS. 1M and 1N are sequential vertical cross-sectional views of a second variation of the first exemplary device structure according to the first embodiment of the present disclosure.
Figure 1N:
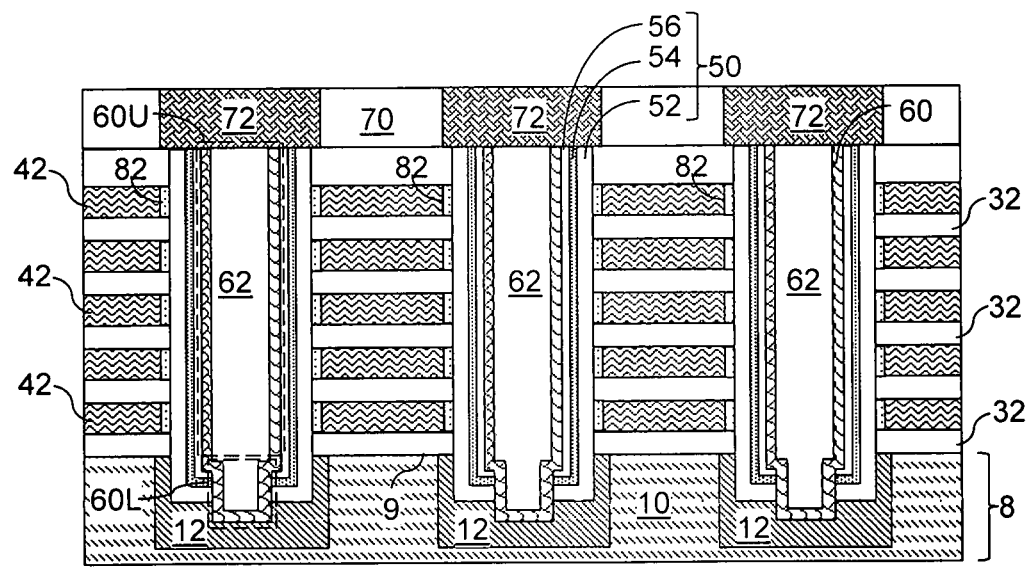

FIGS. 1M and 1N illustrate a second alternative structure for the first exemplary device in which physically exposed portions of the semiconductor substrate 8 are vertically recessed while the sacrificial material layers 57 are present on the memory films 50. In other words, the memory opening 49 is extended further into the substrate 8 after the sacrificial material layers 57 are formed. As discussed above, the memory films 50 include remaining vertical portions of the memory film layer 50C (See FIG. 1F). The vertical recessing of the physically exposed portions of the semiconductor substrate 8 can be performed, for example, by an anisotropic etch process. The anisotropic etch process can be a continuation of the anisotropic etch process employed to remove horizontal portions of the memory film layer 50C, or can be an anisotropic etch process employing another etch chemistry that is different from the etch chemistry for removing the horizontal portions of the memory film layer 50C and is selected to remove the semiconductor material of the first electrodes 12 or the substrate semiconductor layer 10. In this case, each memory opening 49 can be expanded by the volume of the removed material from an underlying first electrode 12 or the substrate semiconductor layer 10.

The sidewalls of the recessed portion of each first electrode 12 or the substrate semiconductor layer 10 can be vertically coincident with the inner sidewalls of an annular portion of the overlying memory film 50 and with the inner sidewalls of the overlying sacrificial material layer 57. The recess depth of the recessed surface of a first electrode from the horizontal plane including the bottommost surface of an overlying memory film 50 can be in a range from 1 nm to 30 nm, although lesser and greater recess depths can also be employed.

Referring to FIG. 1N, the processing steps of FIGS. 1H, 1I, 1J, and 1K can be subsequently performed. Alternatively, the processing steps for the first variation of the first exemplary device structure can be performed. Within the second variation of the first exemplary device structure, a first horizontal surface of the single crystalline semiconductor material portion (such as a top surface of a first electrode 12 or the substrate semiconductor layer 10 that is located below the horizontal plane including the major surface 9 and above the recessed surface of the first electrode 12 obtained by the processing step of FIG. 1M) is in contact with a horizontal surface of an overlying memory film 50. Further, a second horizontal surface of the single crystalline semiconductor material portion (such as the recessed surface of the first electrode 12 obtained by the processing step of FIG. 1M) that is vertically offset with respect to the first horizontal surface is in contact with an overlying semiconductor channel (i.e., the through-stack channel 60).

Figure 2A:
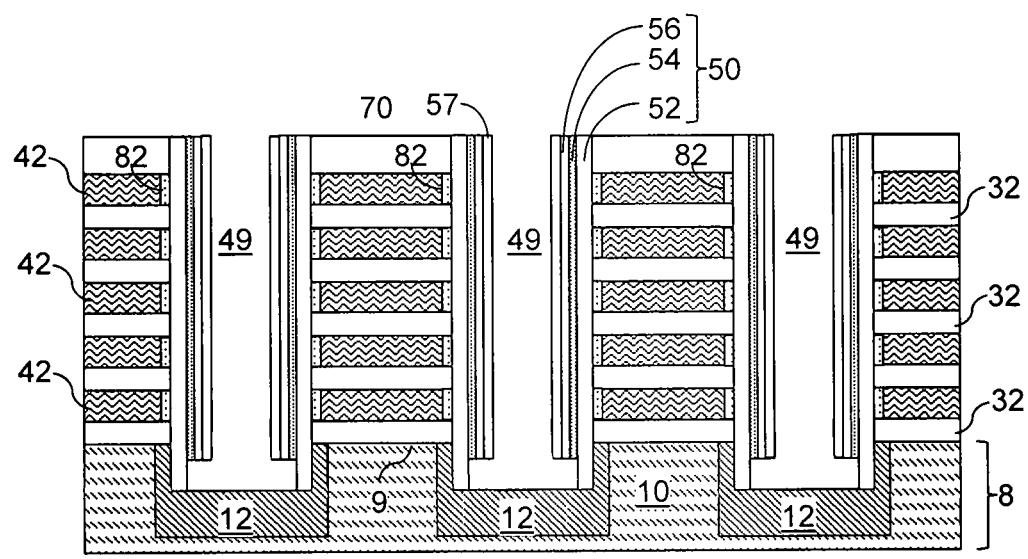
FIGS. 2A and 2B are sequential vertical cross-sectional views of a method of making a second exemplary device structure according to a second embodiment of the present disclosure.

Referring to FIG. 2A, a second exemplary device structure according to a second embodiment of the present disclosure can be derived from the first exemplary device structure of FIG. 1G by etching a horizontal portion of each memory film 50 from underneath the sacrificial material layers 57. Specifically, physically exposed portions of the memory films 50 (which include the horizontal portions of the memory films 40) can be isotropically etched employing the sacrificial material layers 57 as an etch mask. The material of the sacrificial material layers 57 and the etch chemistry of the isotropic etch can be selected such that the chemistry of the isotropic etch is selective to the material of the sacrificial material layers 57. For example, if the sacrificial material layers 57 include silicon nitride, a hydrofluoric acid (HF) based wet etch chemistry can be employed to remove the physically exposed portions of the memory films 50.

In one embodiment, the entirety of the annular portion (i.e., the horizontal portion) of each memory film 50 can be removed by the isotropic etch. Further, the topmost portions of the memory film 50 near the top surface of the alternating stack (32, 42, 82) can be collaterally recessed (not illustrated). The area of a lower portion of the cavity underlying the horizontal plane including the bottom surfaces of the sacrificial material layers 57 becomes greater than the area of an upper portion of the cavity that overlies the horizontal plane including the bottom surfaces of the sacrificial material layers 57. The outer extent of the lower portion of the cavity may extend to the vertical planes including the vertical boundaries of an overlying memory opening 49 (See FIG. 1D), or may extend to a lesser extent than the vertical planes including the vertical boundaries of an overlying memory opening 49.

Figure 2B:
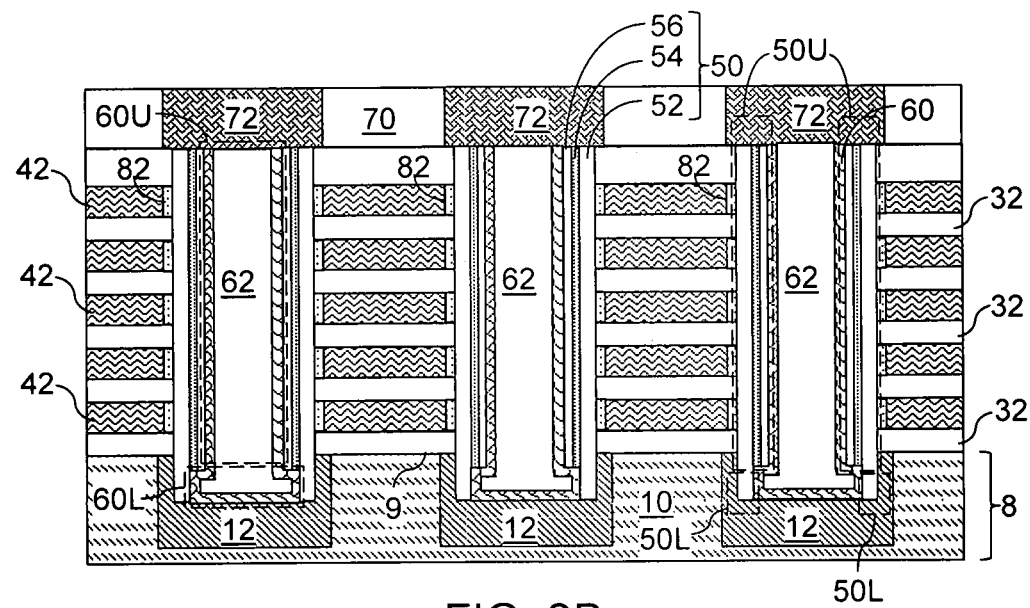

Referring to FIG. 2B, the processing steps of FIGS. 1H, 1I, 1J, and 1K can be subsequently performed. Within the second exemplary device structure illustrated in FIG. 2B, an outer sidewall of the lower portion 60L of the semiconductor channel (i.e., the through-stack channel 60) extends farther outward from a geometrical center of the memory opening 49 (See FIG. 1D) than an outer sidewall of the upper portion 60U of the semiconductor channel. Further, a lower portion 50L of the memory film 50 has a lesser thickness than an upper portion 50U of the memory film 50 that contacts the upper portion 60U of the through-stack channel 60. In other words, the blocking dielectric 52 portion of the memory film 50 remains while the charge storage region 54 and tunnel dielectric portions 56 are removed. Because of the presence of an undercut region in the cavity formed after the processing steps of FIG. 2A, the through-stack channel 60 contacts a bottom surface of the memory film 50.

Figure 2C:
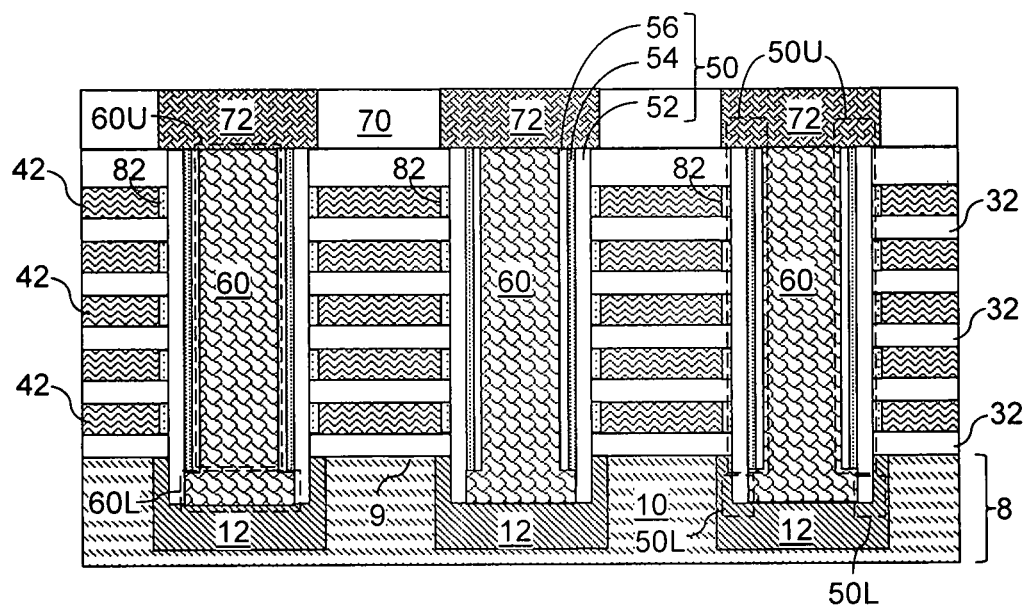
FIG. 2C is a vertical cross-sectional view of a first variation of the second exemplary device structure according to the second embodiment of the present disclosure.

A first alternative structure for the second exemplary device structure is illustrated in FIG. 2C. This embodiment is similar to that of FIG. 1L in that the dielectric core 62 is omitted and the channel 60 fills the entire middle memory opening 49. However, the device of FIG. 2C is different from that of FIG. 1L is that the device of FIG. 2C also includes the lateral recess described above with respect to FIGS. 2A and 2B.

Figure 2D:
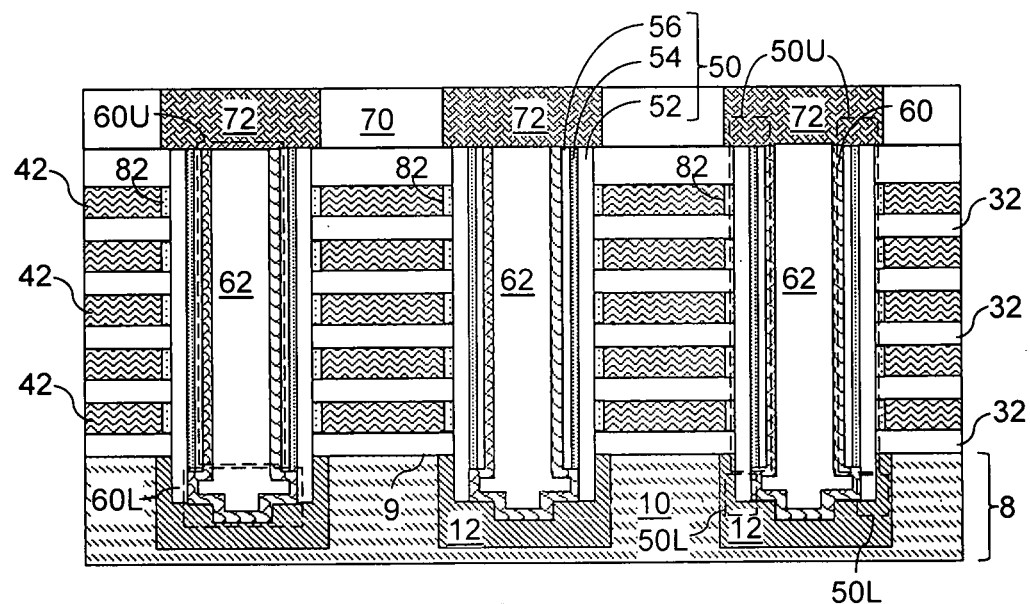
FIG. 2D is a vertical cross-sectional view of a second variation of the second exemplary device structure according to the second embodiment of the present disclosure.

A second alternative structure for the second exemplary device structure is illustrated in FIG. 2D. This embodiment is similar to that of FIGS. 1M and 1N in that it includes the vertical recess of the substrate that is described above. However, the device of FIG. 2D is different from that of FIG. 1N is that the device of FIG. 2D also includes the lateral recess described above with respect to FIGS. 2A and 2B. The omission of the dielectric core 62 and the vertical recess may be used in combination in the same device if desired.

The device of FIG. 2D may be formed by performing the vertical recess of the substrate shown in FIG. 1M followed by subsequently performing the processing steps of FIG. 2A (i.e., the lateral etching of horizontal portions of the memory films 50 employing the sacrificial material layers 57 as an etch mask), followed by the processing steps of FIGS. 1H, 1I, 1J, and 1K.

In this device structure of FIG. 2D, a first horizontal surface (such as the horizontal surface of a first electrode 12 in physical contact with the bottommost surface of an overlying memory film 50) can be in contact with a horizontal surface of a memory film 50. Further, a second horizontal surface (such as the most recessed top surface of the first electrode 12) that is vertically offset with respect to the first horizontal surface can be in contact with the semiconductor channel (i.e., the though-stack channel 60). A lower portion 50L of the memory film 50 can have a lesser thickness than an upper portion 50L of the memory film 50 that contacts the upper portion of the silicon channel 60. Because of the presence of an undercut region in the cavity formed after the processing steps of FIG. 2A, the semiconductor channel (i.e., the through-stack channel 60) contacts a bottom surface of the memory film 50.

Figure 3A:
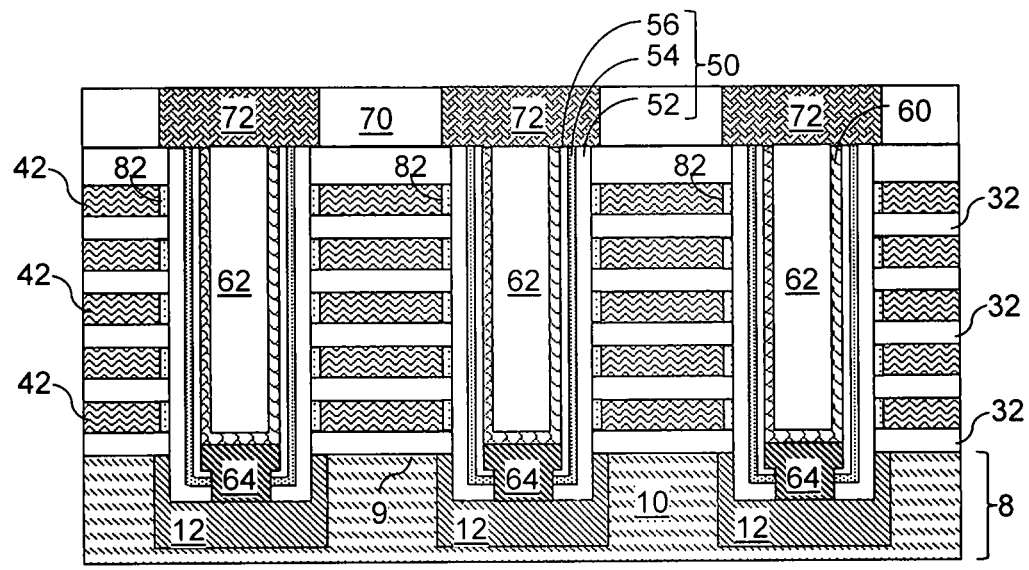
FIG. 3A is a vertical cross-sectional views of a third exemplary device structure according to a third embodiment of the present disclosure.

FIG. 3A illustrates a third exemplary device structure according to a third embodiment of the present disclosure. This embodiment differs from the embodiments of FIGS. 1A-1N and 2A-2D in that a semiconductor channel (60, 64) includes a lower portion and an upper portion. The lower portion of the semiconductor channel (60, 64) is an epitaxial channel 64, which is an epitaxial semiconductor (e.g., single crystal epitaxial silicon) pillar that is epitaxially grown from a surface of a single crystal semiconductor material in the substrate 8. The upper portion of the semiconductor channel (60, 64) is a through-stack channel 60 as described above, and comprises a polycrystalline or amorphous semiconductor material (e.g., polysilicon). The through-stack channel 60 and the epitaxial channel 64 can have a doping of the same conductivity type, i.e., either p-type, n-type, or intrinsic.

Each epitaxial channel 64 is formed directly on each physically exposed surface of single crystalline semiconductor material portions located within or on the semiconductor substrate 8. Each single crystalline semiconductor material portions can be a first electrode 12 or the substrate semiconductor layer 10 underlying a memory film 60. Above each first electrode 12, the epitaxial channel 64 overlying the first electrode 12 can be another single crystalline semiconductor material portion having a single crystalline structure that is in epitaxial alignment with the underlying single crystalline semiconductor material portion of the first electrode 12. As such, each first electrode 12 is herein referred to as a first single crystalline semiconductor material portion, and each epitaxial channel 64 is herein referred to as a second single crystalline semiconductor material portion. In one embodiment, the first electrodes 12 and the epitaxial channel 64 can have a doping of a same conductivity type, which can be p-type or n-type.

The epitaxial channel 64 can be formed, for example, by selective epitaxy. During a selective epitaxy process, at least one semiconductor precursor gas (such as $SiH_4$, $Si_2Cl_2$, $SiCl_3$, $SiCl_4$, $Si_2Cl_6$, or combinations thereof) is flowed into a process chamber including the first exemplary device structure of FIG. 1H. At least one etchant gas such as HCl is flowed simultaneously or alternately into the process chamber. The ratio between the flow rate of the at least one semiconductor precursor gas and the flow rate of the at least one etchant gas is selected such that deposition of a semiconductor material occurs on crystalline surfaces such as the semiconductor surfaces of the first electrodes 12 or the substrate semiconductor layer 10, while deposition of the semiconductor material on amorphous surfaces such as the surfaces of the various dielectric materials of the memory films 50 and the top surface of the alternating stack (32, 42, 82) is suppressed. Thus, the deposition of the semiconductor material proceeds only from the top surface of the substrate exposed in the memory openings 49. Further, the process parameters can be selected such that the epitaxial channels 64 can be single crystalline and in epitaxial alignment with the single crystalline structures of the substrate. Each of the epitaxial channels 64 can be formed as a single crystalline semiconductor material portion directly on a single crystalline surface of the substrate 8, and specifically on a single crystalline surface of a first electrode 12 or the substrate semiconductor layer 10, by selective epitaxy.

Subsequently, the processing steps of FIGS. 1I, 1J, and 1K can be performed to provide the third exemplary device structure illustrated in FIG. 3A. The semiconductor material layer 60C is formed directly on the epitaxial channels 64. Optionally, the thickness of the semiconductor material layer 60C can be increased at the processing step of FIG. 1I to fill the entire volume of each cavity, and the processing step for formation of a core dielectric material layer can be eliminated to omit the dielectric cores 62 as in the first variation of the first exemplary device structure of FIG. 1L.

The third exemplary device structure of FIG. 3A is a three-dimensional memory device that includes a substrate 8 having a major surface 9, and an alternating stack (32, 42, 82) of insulating material layers composed of the first material layers 32 and control gate electrodes composed of the second material layers 42 located over the substrate 8. The alternating stack has a memory opening 49 (See FIG. 1D) extending through the alternating stack (32, 42, 83) in a direction substantially perpendicular to the major surface 9. The third exemplary device structure further includes a memory film 50 located at a peripheral region of the memory opening 49, and a semiconductor channel (60, 64) including an upper portion extending substantially perpendicular to the major surface 9 and contacting an inner sidewall of the memory film 50, and a lower portion (i.e., the epitaxial channel 64) contacting a single crystalline semiconductor material portion (such as a first electrode 12 or the substrate semiconductor layer 10) located on the substrate 8.

A sidewall of the upper portion (i.e., an upper portion of the through-stack channel 60) of the semiconductor channel (60, 64) can be laterally offset with respect to a sidewall of the lower portion (i.e., the epitaxial channel 64) of the semiconductor channel (60, 64). An outer sidewall of the upper portion of the semiconductor channel (60, 64) (i.e., the outer sidewall of the through-stack channel 60) in contact with a first portion of the memory film 50 is laterally offset with respect to an outer sidewall of the lower portion of the semiconductor channel (i.e., the epitaxial channel 64) in contact with a second portion of the memory film 50.

Because the through-stack channel 60 is formed by a single semiconductor material layer deposition, the through-stack channel 69 does not include a substantially contiguous interface extending along the vertical direction, i.e., along a direction parallel to an outer surface of the through-stack channel 60. In other words, a contiguous surface composed of grain boundaries, and different from the outer surface of the through-substrate channel 60, does not exist within the semiconductor channel (60, 64). For this reason, the semiconductor channel (60, 64) including the through-stack channel 60 does not include a substantially contiguous interface vertically extending through a plurality (e.g., at least 2, such as at least 5, such as all) of the control gate electrodes 42 within the alternating stack (32, 42). The semiconductor channel (60, 64) does not include a substantially contiguous interface composed of grain boundaries, not contacting the memory film 50, and vertically extending through the control gate electrodes 42.

A contiguous interface having a closed periphery and not having any hole therein is present between a single crystalline doped semiconductor material portion (such as the epitaxial channels 64) and the through-stack channel 60. The entirety of the closed periphery is contained within surfaces of the memory film 50 and above a horizontal plane including a bottommost surface of the memory film 50. As used herein, a "closed periphery" is a periphery of a closed shape.

In one embodiment, the single crystalline doped semiconductor material portion located in the substrate 8 can be a first electrode 12 or the substrate semiconductor layer 10. The single crystalline doped semiconductor material portion of the epitaxial channels 64 can be in epitaxial alignment with the single crystalline doped semiconductor material portion of the first electrode 12 or the substrate semiconductor layer.

In one embodiment, the amount of the deposited semiconductor material can be selected such that the topmost surface of an epitaxial channel 64 is formed above the horizontal plane including a top surface of a horizontal portion (the annular portion) of a memory film 50. In this case, the epitaxial channels 64, as a single crystalline doped semiconductor portion, includes a region that overlies a horizontal portion of the memory film 50. The epitaxial channel 64 can contact an inner sidewall of the memory film 50, and the first electrode 12 can contact a bottommost surface of the memory film 50

Figure 3B:
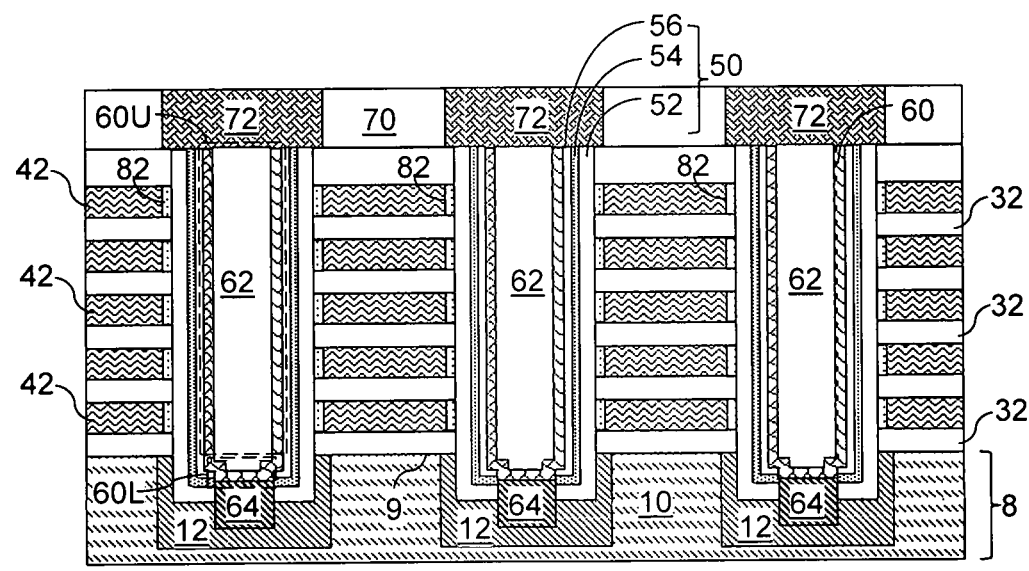
FIG. 3B is a vertical cross-sectional view of a first variation of the third exemplary device structure according to the third embodiment of the present disclosure.

FIG. 3B illustrates a first alternative structure for the third exemplary device structure which contains shorter portions 64 than those in FIG. 3A. This device can be formed employing the methods for forming the third exemplary device structure illustrated in FIG. 3A with a reduction for the amount of the deposited semiconductor material for the epitaxial channels 64. In this case, the topmost surface of an epitaxial channel 64 can be formed below the horizontal plane including a top surface of a horizontal portion (the annular portion) of a memory film 50.

Figure 3C:
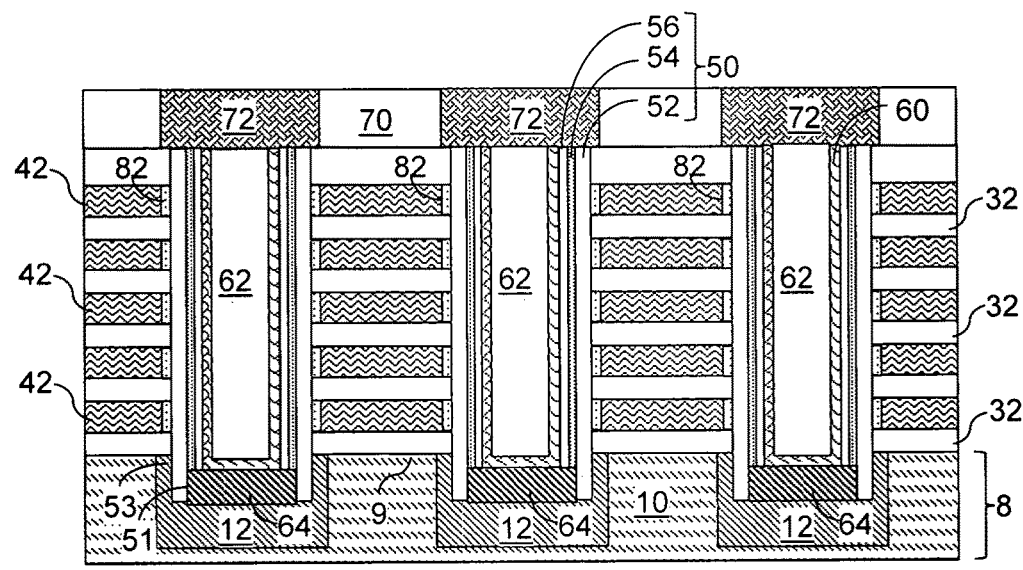
FIG. 3C is a vertical cross-sectional view of a second variation of the third exemplary device structure according to the third embodiment of the present disclosure.

FIG. 3C illustrates a second alternative structure for the third exemplary device structure. This embodiment includes both the lateral recess of FIG. 2A and the portion 64 of FIG. 3A. This device can be formed forming the lateral recess shown in FIG. 2A, then removing the sacrificial material layers 57, and then performing the selective epitaxy process employed to form the epitaxial channels 64. Subsequently, the processing steps of FIGS. 1I, 1J, and 1K can be performed to provide the device structure illustrated in FIG. 3C.

The second alternative structure for the third exemplary device structure is a three-dimensional memory device that includes a substrate 8 having a major surface 9, and an alternating stack (32, 42, 82) of insulating material layers composed of the first material layers 32 and control gate electrodes composed of the second material layers 42 located over the substrate 8. The alternating stack has a memory opening 49 (See FIG. 1D) extending through the alternating stack (32, 42, 83) in a direction substantially perpendicular to the major surface 9. The second variation of the third exemplary device structure further includes a memory film 50 located at a peripheral region of the memory opening 49, and a semiconductor channel (60, 64) including an upper portion (i.e., an upper portion of the through-stack channel 60) extending substantially perpendicular to the major surface 9 and contacting an inner sidewall of the memory film 50; and a lower portion (i.e., the epitaxial channel 64) contacting a single crystalline doped semiconductor material portion (such as a first electrode 10 or the substrate semiconductor layer 10) located within the substrate 8.

A sidewall of the upper portion (i.e., an upper portion of the through-stack channel 60) of the semiconductor channel (60, 64) can be laterally offset with respect to a sidewall of the lower portion (i.e., the epitaxial channel 64) of the semiconductor channel (60, 64). For example, an outer sidewall of the upper portion of the semiconductor channel (60, 64) (i.e., the outer sidewall of the through-stack channel 60) in contact with a first portion of the memory film 50 is laterally offset with respect to an outer sidewall of the lower portion of the semiconductor channel (i.e., the epitaxial channel 64) in contact with a second portion of the memory film 50. The epitaxial channel 64 can be in contact with a bottom portion of the through-stack channel 60. A vertical interface between the single crystalline doped semiconductor material portion of the epitaxial channels 64 and a second inner sidewall 51 of the memory film 50 laterally extends farther out from a geometrical center of the memory opening than an outer sidewall of the through-stack channel 60.

Because the through-stack channel 60 is formed by a single semiconductor material step, the through-stack channel 69 does not include a substantially contiguous interface extending along the vertical direction, i.e., along a direction parallel to an outer surface of the through-stack channel 60.

In other words, a contiguous surface composed of grain boundaries and different from the outer surface of the through-substrate channel 60 does not exist within the semiconductor channel (60, 64). For this reason, the semiconductor channel (60, 64) including the through-stack channel 60 does not include a substantially contiguous interface vertically extending through a plurality (such as at least 2, such as at least 5, such as all) of the control gate electrodes 42 within the alternating stack (32, 42). Thus, the semiconductor channel (60, 64) does not include a substantially contiguous interface composed of grain boundaries, not contacting the memory film 50, and vertically extending through the semiconductor channel between a plurality of the control gate electrodes 42.

A bottom portion of the memory film 50 includes the second inner sidewall 51 on an inner side and an outer sidewall 53 on an outer side. A sidewall of the single crystalline doped semiconductor material portion contacts the second inner sidewall 51 of the memory film 50. The single crystalline doped semiconductor material portion of the epitaxial channels 64 contacts a top surface of another single crystalline doped semiconductor material portion of a first electrode 12 within the substrate 8.

Figure 3D:
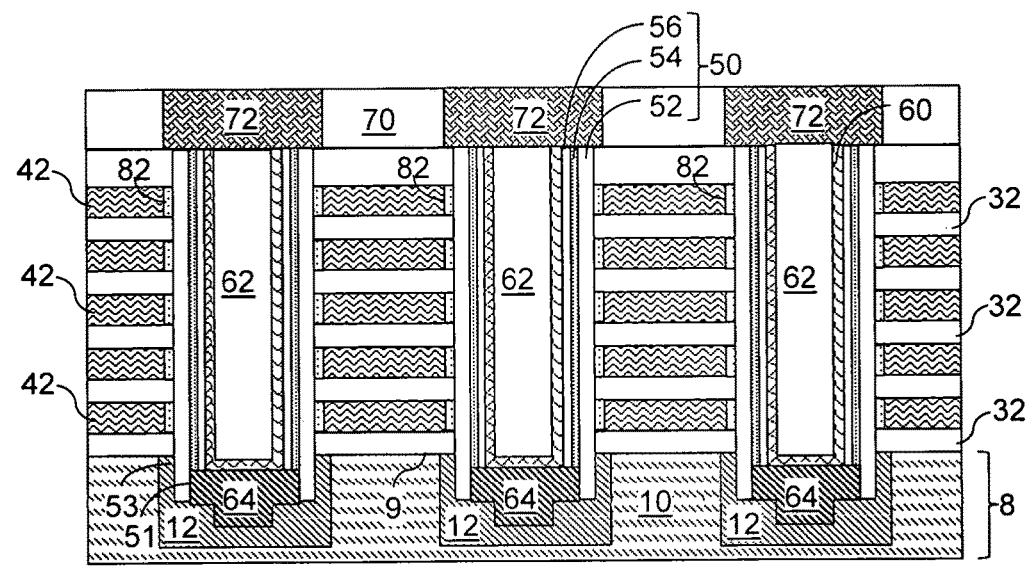
FIG. 3D is a vertical cross-sectional view of a third variation of the third exemplary device structure according to the third embodiment of the present disclosure.

FIG. 3D illustrates a third alternative structure for the third exemplary device structure. This embodiment includes both vertical substrate recess of FIGS. 1M and 1N and the portion 64 of FIG. 3A, optionally the lateral recess of FIG. 2A. Referring to FIG. 3D, a this device may be formed by performing the lateral recess of FIG. 2A, followed by performing the vertical recess of FIG. 1M and then performing the selective epitaxy process employed to form the epitaxial channels 64 of FIG. 3A. Alternatively, the vertical recess of FIG. 1M may be performed firm followed by subsequently performing the processing steps of FIG. 2A (i.e., the lateral etching of horizontal portions of the memory films 50 employing the sacrificial material layers 57 as an etch mask), followed by the selective epitaxy process employed to form the epitaxial channels 64.

In this device, each single crystalline doped semiconductor material portion of the epitaxial channels 64 contacts two top surfaces of another single crystalline doped semiconductor material portion of the substrate 8. The two top surfaces of the first substrate 8 are vertically offset from each other. Optionally, dielectric core 62 may be omitted in the devices of FIGS. 3A-3D as described above with respect to FIG. 1L.

While the present disclosure has been described employing embodiments in which the alternating stack (32, 42, 82) is initially formed as a stack including insulating material layers composed of the first material layers 32 and control gate electrodes composed of the second material layers 42, the various embodiments of the present disclosure is compatible with embodiments in which an alternating stack is initially formed as a stack including insulating material layers as the first material layers 32 and sacrificial material layers as the second material layers 42. The sacrificial material layers occupy the volumes of the control gate electrodes to be subsequently formed. In this case, the sacrificial material layers can be replaced with control gate electrodes including a conductive material at a subsequent processing step, which can be, for example, after formation of the semiconductor channels and prior to, or after, formation of the second electrodes 72. All such variations are expressly contemplated herein.

In any of the methods described above, the control gate electrodes, and optionally the blocking dielectric and/or the charge storage region(s) may be formed by a replacement process through a back side opening 84, as shown in FIGS. 4-11. While the present disclosure is described employing an embodiment in which the first electrodes 12 are formed directly underneath the memory openings, embodiments are expressly contemplated herein in which the first electrodes (e.g., source or drain regions) are laterally offset from the memory openings, as described below.

Figure 4:
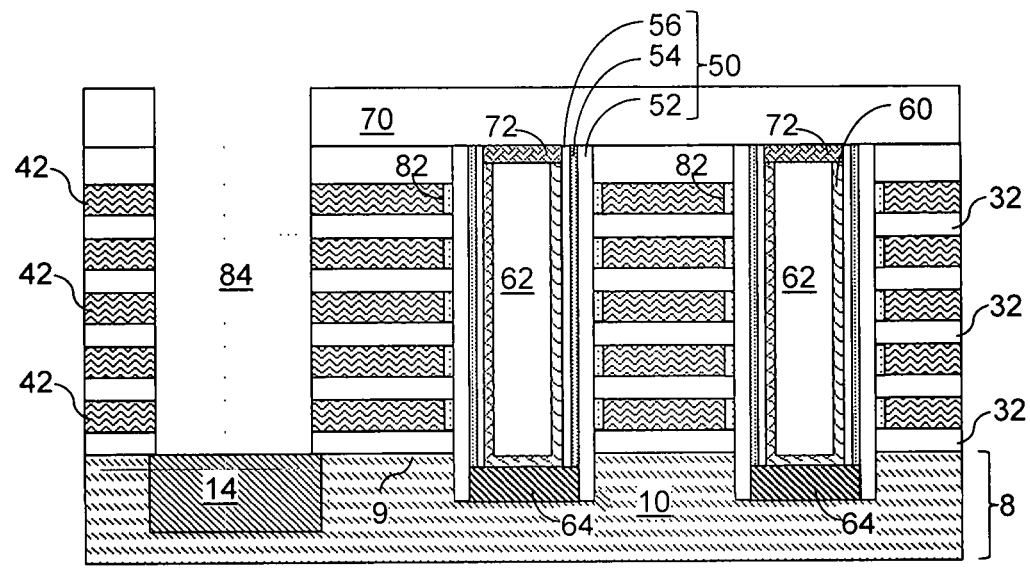
FIGS. 4 to 11 are side cross-sectional views of steps in a method of forming metal replacement gates in the NAND strings in any of exemplary device structures of the previous embodiments.

FIG. 4 illustrates an exemplary device structure following the filling of the memory openings and formation of the second electrodes and the top dielectric layer 70 according to any of the embodiments above. The second electrodes 72 can be recessed relative to the top surface of the alternating stack (32, 42), or can be formed on the top surface of the alternating stack (32, 42). The top surfaces of the second electrodes 72 may be physically exposed, or may be covered by the top dielectric layer 72, which can function as a hard mask layer. The second electrodes 72 may function as a source region or as a drain region of a vertical memory device. As shown in FIG. 4, a back side opening 84 (e.g., a slit trench) is then formed through the alternating stack (32, 42) by any suitable lithography and etching steps. A surface of the substrate 8 can be physically exposed at the bottom of the back side opening 84. The physically exposed surface can be a surface of a doped well, which can be, for example, a p-type doped well (p-well) located in the substrate 8.

If desired, a source/drain region 14 may be formed in the substrate semiconductor layer 10 in the substrate 8 by ion implantation through the back side opening 84. In one embodiment, the source/drain region 14 may be a source region, and can have an opposite conductivity type (e.g., n-type) to that of the substrate semiconductor layer 10 (e.g., a p-type well) and the semiconductor channel (60 and optionally 64). Thus, the channel of the memory device can have a vertical portion including the through-stack channel 60 (and optionally an epitaxial channel 64) and a horizontal portion in the substrate semiconductor layer 10 and extending between the source/drain region 14 and the bottommost portion of the semiconductor channel (60 and optionally 64).

Figure 5:
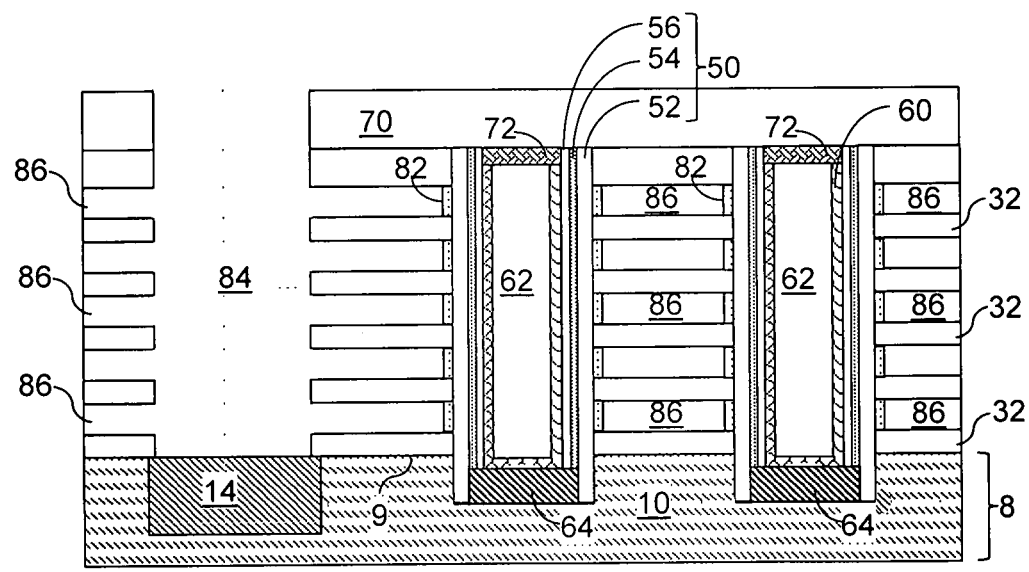

Then, at least a portion of the sacrificial material layers (embodied as the second material layers 42) can be removed through the back side openings 84 to form back side recesses 86 between vertically adjacent pairs of the first material layers 32, as shown in FIG. 5. During and after the removal of sacrificial second material layers 42, the filled-in memory holes (each of which contains a memory film, a through-stack channel 60, and optionally a dielectric core 62) function as supporting structural elements ensuring mechanical stability of the remainder of the alternating material stack. In a non-limiting illustrative example, in case the first material layers 32 include silicon oxide and the second material layers 42 include silicon nitride, the second material layers 42 may be removed by selective etching, such as a silicon nitride selective etching which removes silicon nitride but does not remove the silicon oxide. The selective etch may stop on oxide-based dielectric materials such as the surface dielectric portions 82, if present, or the blocking dielectrics 52 (See FIG. 1K), which form the outer parts of the memory films 50.

Alternatively or additionally, an additional blocking dielectric (not shown) may be formed from the back side in the back side recesses 86 in addition to, or in lieu of, the surface dielectric portions 82 and/or in addition to, or in lieu of, any remaining portion of the blocking dielectrics 52 prior to forming the control gate electrodes 3 by deposition of a conductive material in the back side recesses 86. In this embodiment, forming the blocking dielectric layer comprises forming the blocking dielectric layer in the back side opening 84 and in the back side recesses 86.

If desired, the at least one charge storage region 54 may be formed through either the front side memory opening 49 or the back side opening 84. Thus, the step of forming the at least one charge storage region can comprise at least one of forming the at least one charge storage region prior to forming the blocking dielectric layer in the back side opening, and/or forming the at least one charge storage region 54 over the pre-existing blocking dielectric 56 in the front side memory opening 49, or over the sidewall in the front side memory opening 49 (if the blocking dielectric is formed through the back side opening 84).

Figure 6:
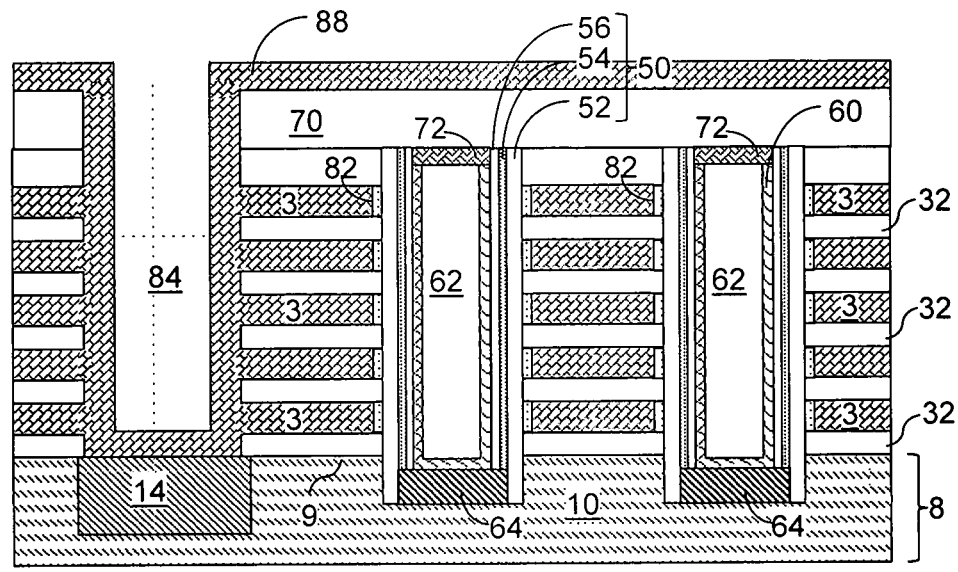

A conductive material comprising at least one metal and/or at least one metal alloy can be deposited to form a contiguous conductive material portion 88, which includes control gate electrodes 3. The control gate electrodes 3 are formed in the back side recesses 86 through the back side openings 84, as shown in FIG. 6. The control gate electrodes 3 of the contiguous conductive material portion 88 can fully fill the back side recesses 86 (See FIG. 5), and portions of the contiguous conductive material portion 88 other than the control gate electrodes 3 can partially or fully fill the back side openings 84 (e.g., trenches) and overlie the top dielectric layer 70. The conductive material of the control gate electrodes 3 may comprise any suitable materials for the second material layers 42 in embodiments in which the second material layers 42 includes a conductive material as described above. For example, the conductive material may comprise a TiN liner or another barrier martial, and additionally tungsten. If a blocking dielectric layer is formed the back side recesses 86 through the back side opening 84, then the control gate electrodes 3 are formed over the blocking dielectric layer in the back side recesses 86.

Figure 7:
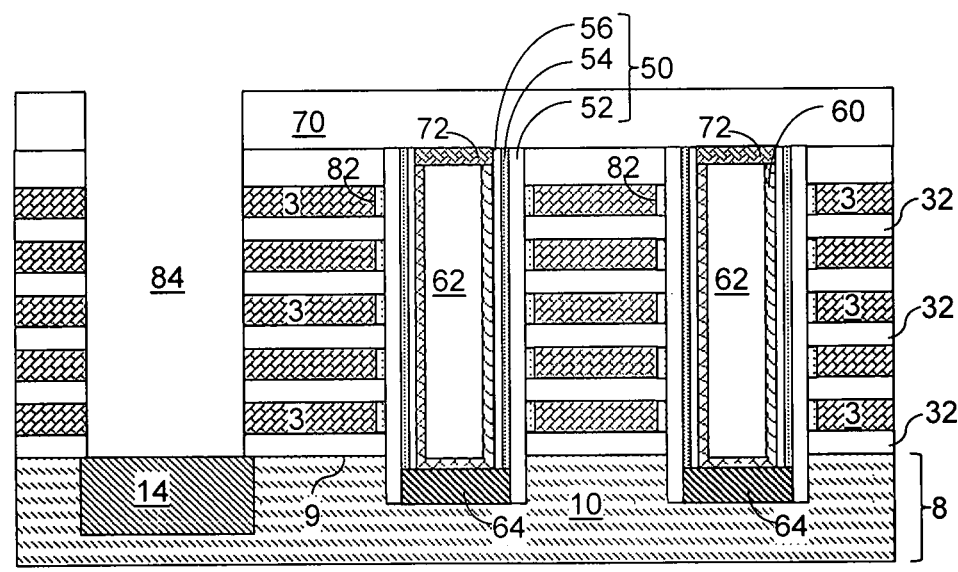

Then, as shown in FIG. 7, sub-portions of the contiguous conductive material portion 88 other than the control gate electrodes 3 are removed from the back side openings 84 (e.g., trenches) and from over the top dielectric layer 70 by at least one etch, which can be an isotropic etch or a combination of an isotropic etch and an anisotropic etch. Thus, the deposited conductive material of the contiguous conductive material portion 88 is removed without removing the control gate electrodes 3 to complete the formation of the control gate electrodes 3. Optionally, select gate electrodes (not shown in FIG. 7 for clarity) may be formed above and below the control gate electrodes 3 at the same time or during a different step.

Figure 8:
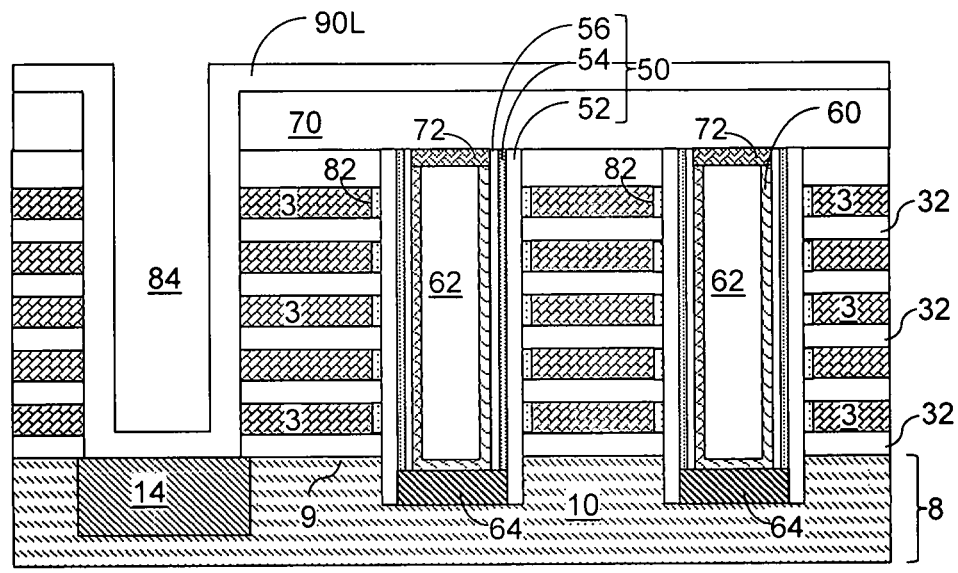
Figure 9:
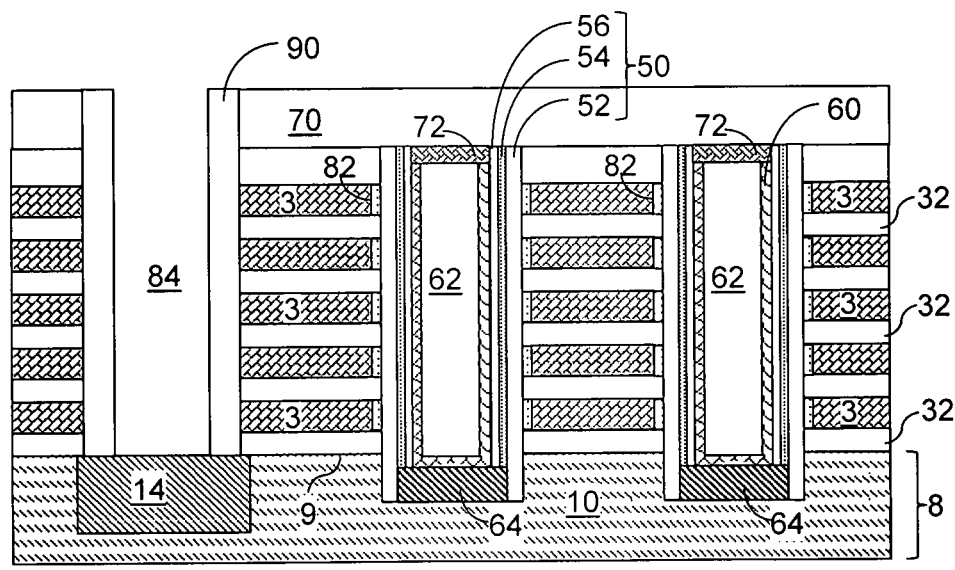

An insulating layer 90L, such as a silicon oxide layer, is formed on sidewalls and bottom of the back side trenches 84 and over the top dielectric layer 70, as shown in FIG. 8. Each horizontal portion of the insulating layer 90L is then removed from the bottom 84a of the back side trench 84 and from above the top dielectric layer 70 by anisotropic etching (e.g., by RIE spacer etch). The remaining portion of the insulating layer 90L on the sidewalls of the trench 84, as shown in FIG. 9, constitutes an insulator spacer 90. This etching step exposes p-well 10 through the bottom 84a of the trench 84.

Figure 10:
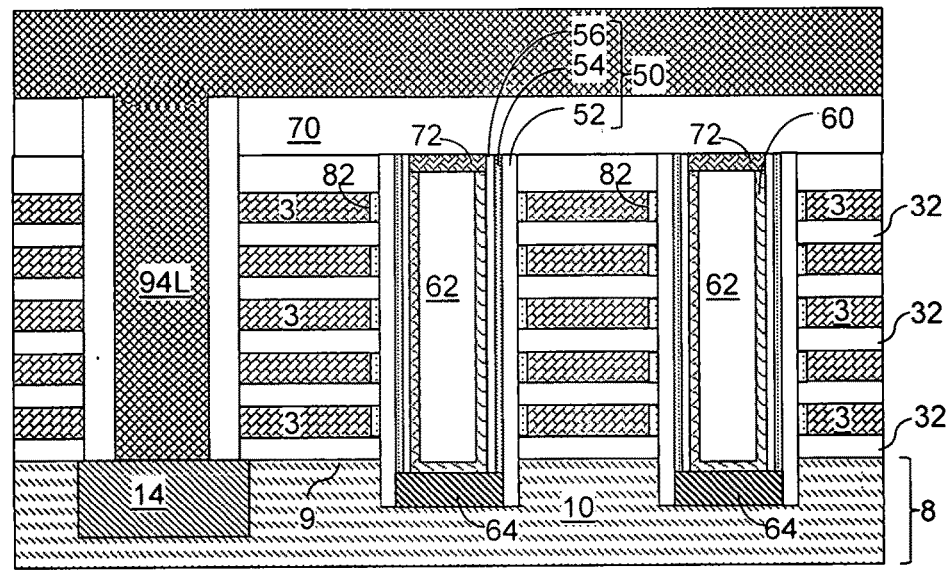
Figure 11:
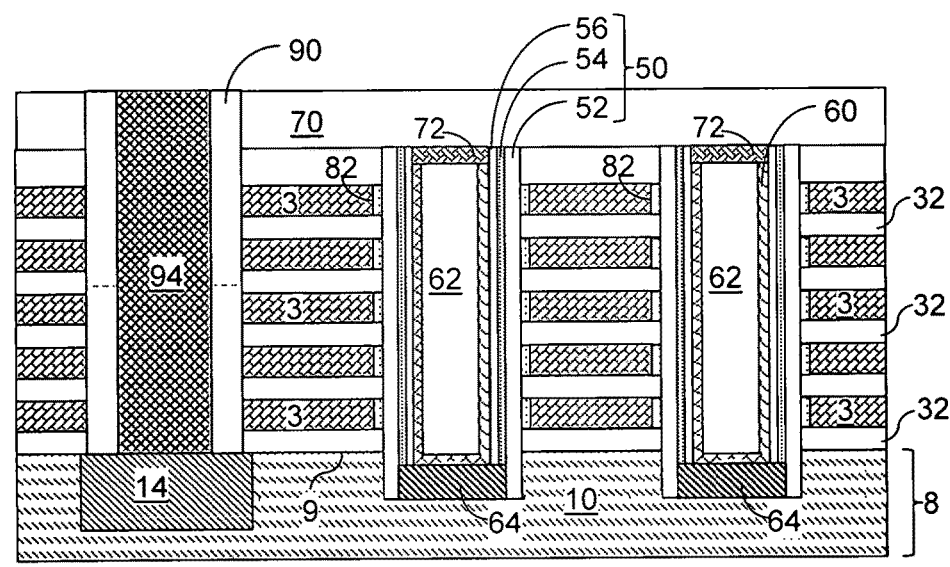

A substrate electrode contact layer 94L can then be formed in the back side trench 84 directly on the source/drain region 14 in the substrate semiconductor layer 10 (which can be, for example, a p-well) in the substrate 8, as shown in FIG. 10. The substrate electrode contact 94L may be formed by depositing any suitable metal or metal alloy layers, such as TiN, ruthenium, and/or tungsten over layer 90 in the back side trench 84. The portion of the substrate electrode contact layer 94L located over the top dielectric layer 70 can be removed by CMP or etching to leave a substrate electrode contact 94 in the dielectrically insulated trench 84, as shown in FIG. 11. If the source/drain region 14 is a source region, the substrate electrode contact 94 can be a source contact.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a substrate having a major surface;
   an alternating stack of insulating material layers and control gate electrodes located over the substrate, the alternating stack having a memory opening extending through the alternating stack in a direction substantially perpendicular to the major surface;
   a memory film located at a peripheral region of the memory opening and comprising a stack containing, from one side to another, a blocking dielectric layer, a charge storage layer, and a tunneling dielectric layer; and
   a semiconductor channel including an upper portion extending substantially perpendicular to the major surface and contacting an inner sidewall of the memory film and a lower portion contacting a single crystalline semiconductor material portion located within or on the substrate, wherein the upper portion of the semiconductor channel is vertically spaced from the single crystalline semiconductor material portion by the lower portion of the semiconductor channel;
   wherein:
   an outer sidewall of the upper portion of the semiconductor channel is laterally offset with respect to an outer sidewall of the lower portion of the semiconductor channel;
   the semiconductor channel does not include a substantially contiguous interface composed of grain boundaries, not contacting the memory film, and vertically extending through the semiconductor channel between a plurality of control gate electrodes;
   the outer sidewall of the lower portion of the semiconductor channel physically contacts an inner sidewall of the blocking dielectric layer;
   an upper surface of the lower portion of the semiconductor channel physically contacts a bottommost surface of the charge storage layer and a bottommost surface of the tunneling dielectric layer;
   the lower portion of the semiconductor channel comprises a lower portion of a polycrystalline semiconductor material layer that contacts the inner sidewall of the blocking dielectric layer, the bottommost surface of the charge storage layer, and the bottommost surface of the tunneling dielectric layer;
   the polycrystalline semiconductor material layer contacts a top surface of the single crystalline semiconductor material portion;
   the polycrystalline semiconductor material layer contacts a sidewall of the single crystalline semiconductor material portion;
   the sidewall of the single crystalline semiconductor material portion is adjoined to the top surface of the single crystalline semiconductor material portion;
   the polycrystalline semiconductor material layer contacts a recessed surface of the single crystalline semiconductor material portion; and
   the recessed surface of the single crystalline semiconductor material portion is adjoined to the sidewall of the single crystalline semiconductor material portion.

2. The three-dimensional memory device of claim 1, wherein the single crystalline semiconductor material portion is a semiconductor material portion of the substrate.

3. The three-dimensional memory device of claim 2, wherein a first horizontal surface of the single crystalline semiconductor material portion is in contact with a horizontal surface of the memory film, and a second horizontal surface of the single crystalline semiconductor material portion that is vertically offset with respect to the first horizontal surface is in contact with the semiconductor channel.

4. The three-dimensional memory device of claim 1, wherein the outer sidewall of the lower portion of the semiconductor channel extends farther outward from a geometrical center of the memory opening than the outer sidewall of the upper portion of the semiconductor channel.

5. The three-dimensional memory device of claim 1, wherein the semiconductor channel contacts a bottom surface of the memory film.

6. The three-dimensional memory device of claim 1, further comprising a dielectric core surrounded by the memory film, wherein a first interface between the dielectric core and the upper portion of the semiconductor channel is laterally offset from a second interface between the dielectric core and the lower portion of the semiconductor channel.

7. The three-dimensional memory device of claim 1, wherein a bottommost surface of the blocking dielectric layer physically contacts the single crystalline semiconductor material portion, and the bottommost surfaces of the charge storage layer and the tunneling dielectric layer are vertically spaced from the single crystalline semiconductor material portion by the lower portion of the semiconductor channel.

8. The three-dimensional memory device of claim 1, wherein the lower portion of the semiconductor channel comprises a single crystalline semiconductor material pillar which is epitaxially grown on the substrate.

9. The three-dimensional memory device of claim 8, wherein a vertical interface between the lower portion of the semiconductor channel and an inner sidewall of the memory film laterally extends farther out from a geometrical center of the memory opening than an outer sidewall of the upper portion of the semiconductor channel.

10. The three-dimensional memory device of claim 1, wherein:
    the substrate comprises a silicon substrate;
    a monolithic three dimensional NAND string in a monolithic, three dimensional array of NAND strings is located over the silicon substrate; and
    at least one memory cell in a first device level of the three dimensional array of NAND strings is located over another memory cell in a second device level of the three dimensional array of NAND strings.

11. The three-dimensional memory device of claim 1, wherein the lower portion of the semiconductor channel comprises a single crystalline semiconductor material pillar that contacts the inner sidewall of the blocking dielectric layer, the bottommost surface of the charge storage layer, and the bottommost surface of the tunneling dielectric layer.

12. The three-dimensional memory device of claim 11, wherein the upper portion of the semiconductor channel comprises a polycrystalline semiconductor material layer that contacts a top surface of the single crystalline semiconductor material pillar.

13. The three-dimensional memory device of claim 11, wherein the single crystalline semiconductor material pillar contacts a top surface of the single crystalline semiconductor material portion.

14. The three-dimensional memory device of claim 1, wherein the upper portion of the semiconductor channel comprises an upper portion of the polycrystalline semiconductor material layer.

15. The three-dimensional memory device of claim 1, further comprising a dielectric core that has a greater lateral extent underneath the bottommost surfaces of the charge storage layer and the tunneling dielectric layer than within a volume that is laterally surrounded by bottom portions of the charge storage layer and the tunneling dielectric layer.

16. The three-dimensional memory device of claim 1, wherein the single crystalline semiconductor material portion that is one of a source region and a drain region.

* * * * *